(12) United States Patent
Maruyama et al.

(10) Patent No.: US 7,838,406 B2
(45) Date of Patent: Nov. 23, 2010

(54) SONOS-NAND DEVICE HAVING A STORAGE REGION SEPARATED BETWEEN CELLS

(75) Inventors: Takayuki Maruyama, Fukushima-Ken (JP); Fumihiko Inoue, Fukushima-Ken (JP)

(73) Assignee: Spansion LLC, Sunnyvale, CA (US)

(*) Notice: Subject to any disclaimer, the term of this patent is extended or adjusted under 35 U.S.C. 154(b) by 89 days.

(21) Appl. No.: 12/343,998

(22) Filed: Dec. 24, 2008

(65) Prior Publication Data

US 2010/0001336 A1  Jan. 7, 2010

(30) Foreign Application Priority Data

Dec. 28, 2007  (JP)  ............... 2007-339663

(51) Int. Cl.
  *H01L 21/3205* (2006.01)
(52) U.S. Cl. ............... 438/591; 438/435; 438/296; 438/257; 438/259; 438/267; 438/261; 438/264; 438/596; 438/303; 257/320; 257/321; 257/322; 257/323; 257/324; 257/325; 257/326; 257/E29.309; 257/E21.21; 257/314; 257/315; 257/316; 257/411; 257/410; 257/406
(58) Field of Classification Search ............... 438/591, 438/435, 296, 257, 259, 267, 261, 264, 596, 438/303; 257/320–326, E29.309, E21.21, 257/314–316, 411, 410, 406
See application file for complete search history.

(56) References Cited

U.S. PATENT DOCUMENTS

| | | | | |
|---|---|---|---|---|
| 6,462,375 B1* | 10/2002 | Wu | .............. | 257/316 |
| 6,479,858 B2* | 11/2002 | Krivokapic | .............. | 257/314 |
| 6,673,677 B2* | 1/2004 | Hofmann et al. | ............ | 438/257 |
| 6,710,396 B1* | 3/2004 | Wu | .............. | 257/315 |
| 6,727,544 B2* | 4/2004 | Endoh et al. | ............ | 257/315 |
| 6,765,258 B1* | 7/2004 | Wu | .............. | 257/315 |
| 6,803,276 B2* | 10/2004 | Kim et al. | .............. | 438/257 |
| 6,927,446 B2* | 8/2005 | Yoshino | .............. | 257/314 |
| 6,979,617 B2* | 12/2005 | Lee | .............. | 438/257 |
| 7,005,349 B2* | 2/2006 | Lee et al. | .............. | 438/261 |
| 7,214,327 B2* | 5/2007 | Chen et al. | .............. | 216/62 |
| 7,242,612 B2* | 7/2007 | Jung | .............. | 365/185.03 |
| 7,312,495 B2* | 12/2007 | Zheng | .............. | 257/314 |
| 7,511,334 B2* | 3/2009 | Lee et al. | .............. | 257/324 |
| 2003/0160280 A1* | 8/2003 | Yoshino | .............. | 257/324 |
| 2003/0203572 A1* | 10/2003 | Yoshino | .............. | 438/257 |
| 2005/0133849 A1* | 6/2005 | Jeon et al. | .............. | 257/314 |
| 2005/0255651 A1* | 11/2005 | Qian et al. | .............. | 438/257 |
| 2006/0131637 A1* | 6/2006 | Kakoschke et al. | ......... | 257/316 |
| 2006/0226468 A1* | 10/2006 | Zheng | .............. | 257/315 |

(Continued)

*Primary Examiner*—Fernando L Toledo
*Assistant Examiner*—Ankush k Singal

(57) ABSTRACT

The present invention is a semiconductor device including a semiconductor substrate having a trench, a first insulating film provided on side surfaces of the trench, a second insulating film of a material different from the first insulating film provided to be embedded in the trench, a word line provided extending to intersect with the trench above the semiconductor substrate, a gate insulating film of a material different from the first insulating film separated in an extending direction of the word line by the trench and provided under a central area in a width direction of the word line, and a charge storage layer separated in the extending direction of the word line by the trench and provided under both ends in the width direction of the word line to enclose the gate insulating film, and a method for manufacturing the same.

11 Claims, 25 Drawing Sheets

U.S. PATENT DOCUMENTS

| | | |
|---|---|---|
| 2007/0058442 A1* | 3/2007 | Shiraiwa et al. ........ 365/185.28 |
| 2007/0096198 A1* | 5/2007 | Hofmann et al. ............ 257/316 |
| 2007/0141796 A1* | 6/2007 | Oh et al. .................... 438/296 |
| 2007/0187742 A1* | 8/2007 | Shino ......................... 257/314 |
| 2008/0153223 A1* | 6/2008 | Liu et al. .................... 438/257 |
| 2009/0004817 A1* | 1/2009 | Kim et al. ................... 438/435 |
| 2009/0026525 A1* | 1/2009 | Wang et al. ................. 257/316 |

* cited by examiner

SONOS-NAND DEVICE HAVING A STORAGE REGION SEPARATED BETWEEN CELLS

CLAIM OF PRIORITY

This application claims priority from Japanese patent application 2007-339663 filed on Dec. 28, 2007

TECHNICAL FIELD

The present invention relates to a semiconductor device and a method for manufacturing the same and, more particularly, to a semiconductor device having a separated charge storage layer and a method for manufacturing the same.

BACKGROUND

A non-volatile memory is a semiconductor device in which data is rewritable and stored data is retained even when the power is turned off. Flash memory is one type of non-volatile memory that has become increasingly popular. In a flash memory, a transistor which constitutes a memory cell has a "charge storage layer" of either a floating gate or an insulating film. Data is stored in a flash memory by accumulating electrical charges in this charge storage layer.

In recent years, various methods to increase the amount of data that can be stored in a single memory cell have been proposed. For example, there is a virtual ground flash memory in which two charge storage regions are provided in a charge storage layer of a single memory cell by switching around a source region and a drain region in operation. With this technique, two bits of data can be stored in a single memory cell instead of one.

Other methods have been proposed to expand the data storage ability. Japanese Patent Application Publication No. JP-A-2006-24922, for example, describes another conventional solution to provide two charge storage regions in a charge storage layer by providing two electrodes on the charge storage layer in a memory cell to store two bits of data in a single memory cell. Furthermore, Japanese Patent Application Publication No. JP-A-2004-343014, for example, describes a conventional technique of a flash memory having a charge storage layer separated from under both ends of a gate electrode to its side surfaces.

However, these solutions are not without their flaws. In a virtual ground flash memory with a conductive film as a charge storage layer, for example, it is required to separate the charge storage layer in a channel direction in a memory cell since stored electric charges move around in the charge storage layer. Meanwhile, in a virtual ground flash memory with an insulating film as a charge storage layer, an influence of a so-called complementary bit disturb (CBD) in which electrical charges stored in two charge storage regions interfere with each other becomes large unless the charge storage layer is separated in a channel direction in a memory cell. As a consequence, separation of electrical charges stored in two charge storage regions becomes difficult. Furthermore, if the charge storage layer is connected between adjacently arranged memory cells, threshold voltages of the adjacently arranged memory cells may be influenced as the electrical charges stored in the charge storage layer move around in the charge storage layer.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to an aspect of the present invention, there is provided a novel semiconductor device including a semiconductor substrate having a trench, a first insulating film provided on side surfaces of the trench, a second insulating film composed of a material different from that of the first insulating film and provided to be embedded in the trench, a word line provided extending to intersect with the trench above the semiconductor substrate, a gate insulating film composed of a material different from that of the first insulating film, separated in direction of the word line by the trench and provided under a central area in a width direction of the word line on the semiconductor substrate, and a charge storage layer separated in the direction of the word line by the trench and provided under both ends in the width direction of the word line on the semiconductor substrate so as to enclose the gate insulating film. According to this aspect, the charge storage layer separated in a channel direction in a memory cell and in between adjacently arranged memory cells can be obtained. Further, the charge storage layer and the word line can be provided in a self-aligning manner.

According to another aspect of the present invention, there is provided a novel method for manufacturing a semiconductor device including: providing a gate insulating film on a semiconductor substrate, forming a trench to extend on the gate insulating film and the semiconductor substrate, providing a first insulating film composed of a material different from that of the gate insulating film on side surfaces of the trench, providing a second insulating film composed of a material different from that of the first insulating film so as to be embedded in the trench, providing a word line extending to intersect with the trench on the gate insulating film, removing the gate insulating film so as to make the gate insulating film remain under a central area in a width direction of the word line on the semiconductor substrate, and providing a charge storage layer in an area where the gate insulating film has been removed under both ends in the width direction of the word line. According to this aspect, the charge storage layer to be separated in a channel direction in a memory cell and in between adjacently arranged memory cells can be provided. Further, the charge storage layer and the word line can be provided in a self-aligning manner.

BRIEF DESCRIPTION OF THE DRAWINGS

The accompanying drawings, which are incorporated in and form a part of this specification, illustrate embodiments of the invention and, together with the description, serve to explain the principles of the invention

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known processes, procedures, components, and circuits have not been described in detail as not to unnecessarily obscure aspects and features of the subject matter.

First Embodiment

Figure 1A:
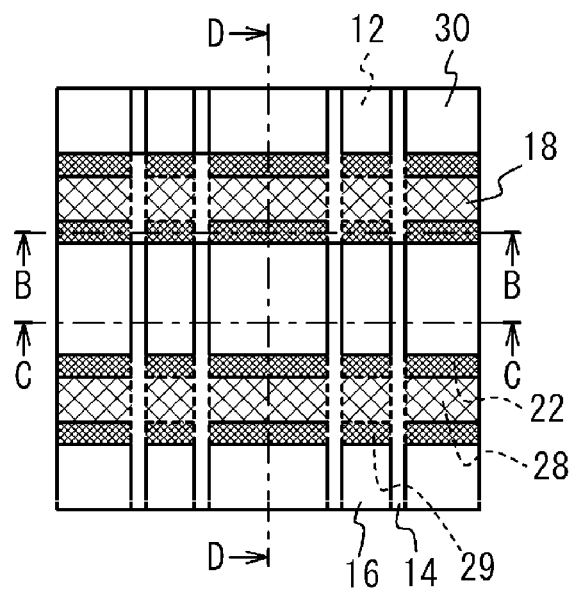
FIG. 1A is a top view of a flash memory according to various embodiments.
Figure 1D:
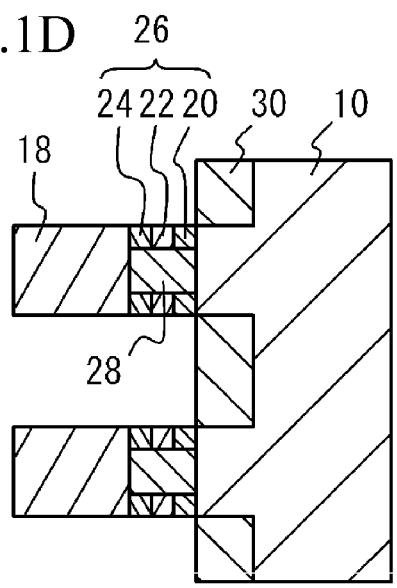
FIGS. 1B through 1D are sectional views taken along the lines B-B to D-D, respectively, shown in FIG. 1A.
Figure 1B:
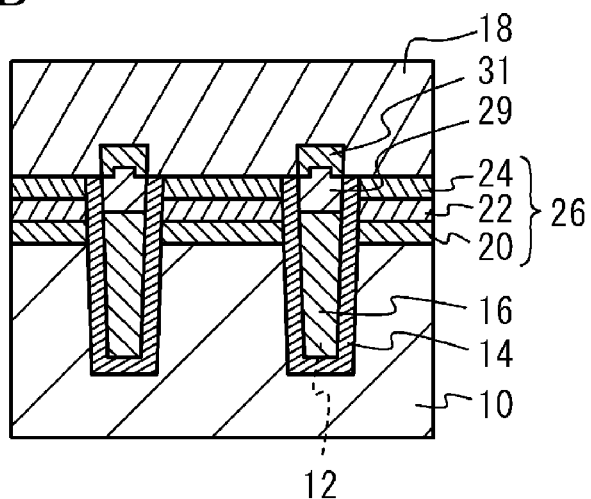
Figure 1C:
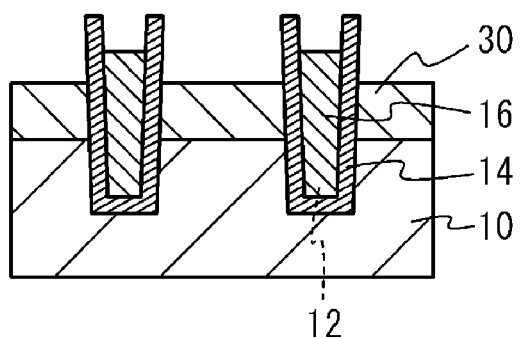

FIG. 1A is a top view of a flash memory according to a first embodiment of the present invention, and FIGS. 1B through 1D are sectional views taken along the lines B-B to D-D, respectively, shown in FIG. 1A. FIG. 1A shows a charge storage layer 22, a gate insulating film 28 and a dummy layer 29 (shaded sections shown in FIG. 1A) viewed through word lines 18 and other layers.

Referring to FIG. 1A, a trench 12 is formed so as to extend in a semiconductor substrate 10. On side surfaces and a bottom surface of the trench 12, a first insulating film 14 is provided. A second insulating film 16 is provided so as to be embedded in the trench 12. The trench 12 embedded with the second insulating film 16 serves as an shallow trench isolation (STI) region. A word line 18 is provided above the semiconductor substrate 10, extending to intersect with the trench 12. In one embodiment, the word line 18 serves as a gate electrode. Diffusion regions 30 which serve as a source region and a drain region are provided between adjacently arranged trenches 12 and on both sides in a width direction of the word line 18 in the semiconductor substrate 10.

Referring to FIGS. 1A through 1D, an upper surface of the first insulating film 14 is provided above an upper surface of the charge storage layer 22. Under a central area in the width direction of the word line 18 on the semiconductor substrate 10, a gate insulating film 28 composed of a material different from that of the first insulating film 14 is provided. The gate insulating film 28 is separated by the first insulating film 14 in an extending direction of the word line 18 at the trench 12. Under both ends in the width direction of the word line 18 on the semiconductor substrate 10, tunnel insulating films 20, charge storage layers 22 and top insulating films 24 are provided in sequence so as to enclose the gate insulating film 28. A layered film 26 composed of the tunnel insulating film 20, the charge storage layer 22, and the top insulating film 24 is separated by the first insulating film 14 in the extending direction of the word line 18 at the trench 12.

According to one embodiment, an upper surface of the gate insulating film 28 and an upper surface of the layered film 26 are provided on the same plane. The upper surface of the layered film 26 and an upper surface of the first insulating film 14 are provided on the same plane. In other words, the upper surface of the gate insulating film 28 and the upper surface of the first insulating film 14 are provided on the same plane. Furthermore, under both ends in the width direction of the word line 18 on the second insulating film 16, a dummy layer 29 composed of the same material as that of the charge storage layer 22 is provided.

Figure 2A:
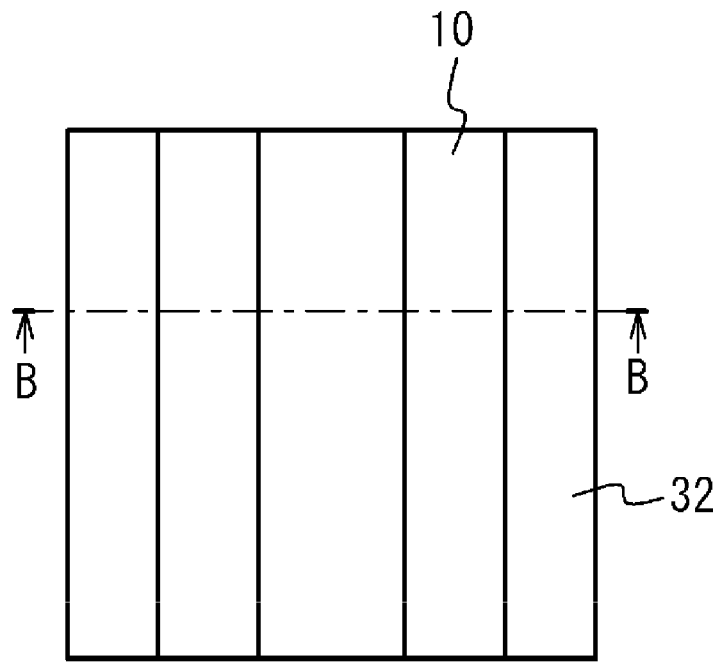
FIG. 2A is a top view of a first stage in a manufacturing process of a flash memory according to various embodiments.
Figure 2B:
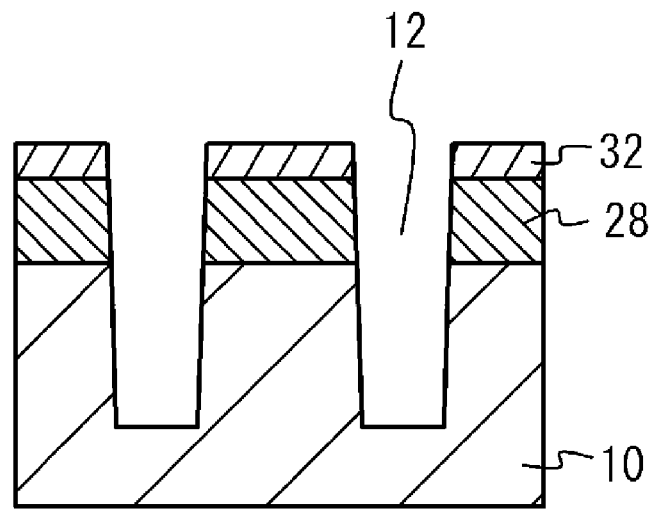
FIG. 2B is a sectional view taken along the line B-B shown in FIG. 2A.

Next, referring to FIGS. 2A through 9D, a method for manufacturing the flash memory according to the first embodiment will be described. Referring to FIGS. 2A and 2B, the gate insulating film 28 formed of a silicon oxide film having a thickness of about 25 nm is provided by thermal oxidation on the semiconductor substrate 10 that is a p-type silicon substrate. A mask layer 32 formed of a silicon nitride film is provided by chemical vapor deposition (CVD) on the gate insulating film 28. The mask layer 32 is etched by reactive ion etching (RIE) with a photoresist (not shown) provided to extend on the mask layer 32 serving as a mask. After the photoresist is removed, the gate insulating film 28 and the semiconductor substrate 10 are etched by RIE with the mask layer 32 serving as a mask. As a consequence, the trench 12 is provided to extend in the gate insulating film 28 and the semiconductor substrate 10. The width of the trench 12 is about 50 nm, and its depth is about 200 nm.

Figure 3A:
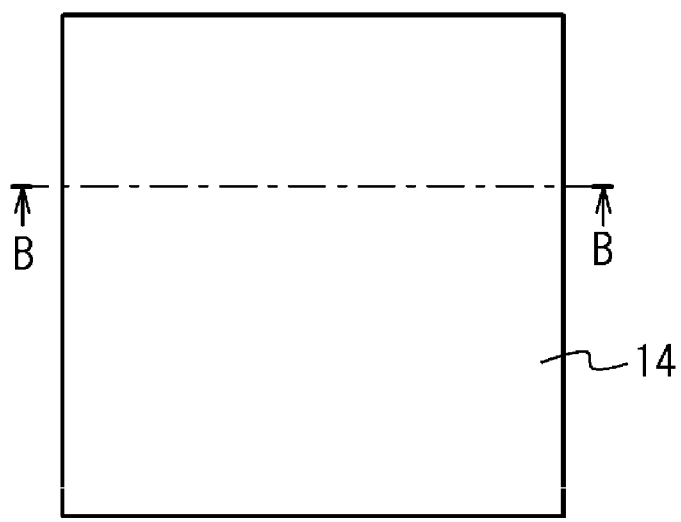
FIG. 3A is a top view of a second stage in a manufacturing process of a flash memory according to various embodiments.
Figure 3B:
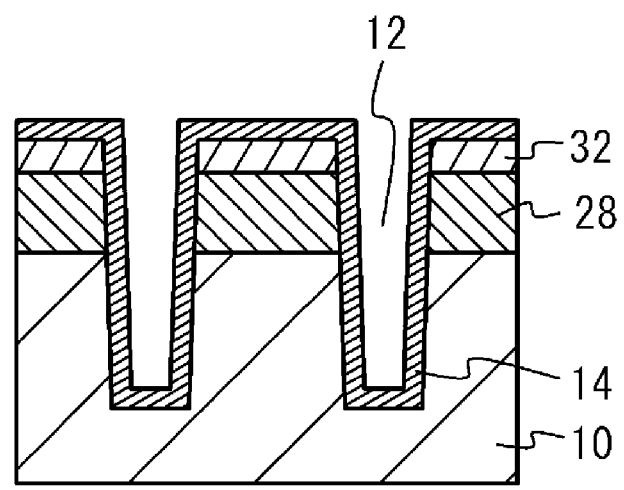
FIG. 3B is a sectional view taken along the line B-B shown in FIG. 3A.

Next, referring to FIGS. 3A and 3B, the first insulating film 14 formed of a silicon nitride film having a thickness of about 10 nm is thoroughly deposited by CVD. Consequently, the first insulating film 14 is provided to run along the side surfaces and the bottom surface of the trench 12.

Figure 4A:
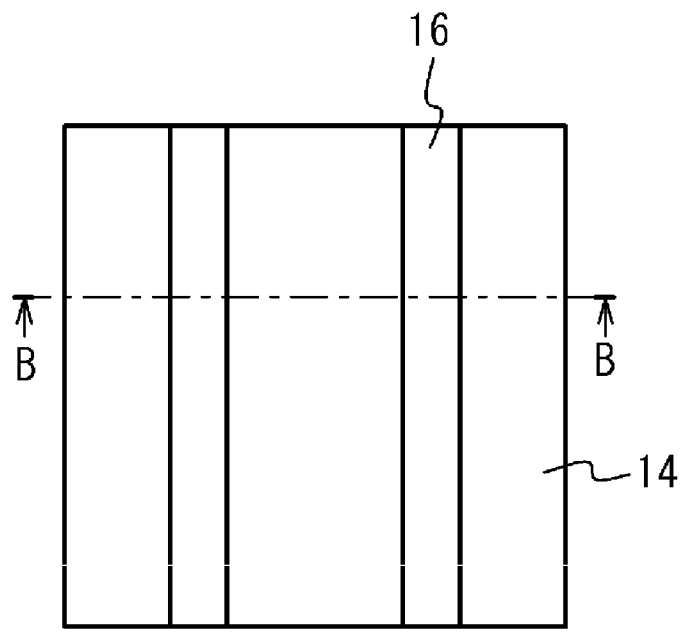
FIG. 4A is a top view of a third stage in a manufacturing process of a flash memory according to various embodiments.
Figure 4B:
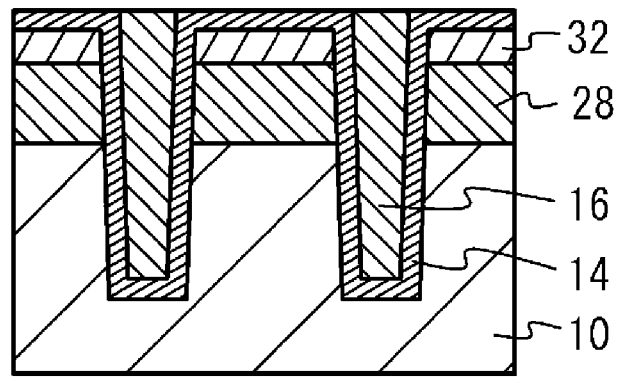
FIG. 4B is a sectional view taken along the line B-B shown in FIG. 4A.

Referring to FIGS. 4A and 4B, the second insulating film 16 formed of a silicon oxide film is thoroughly deposited by high density plasma CVD so as to be embedded in the trench 12. Subsequently, the second insulating film 16 is polished by chemical mechanical polish (CMP) until the upper surface of the first insulating film 14 is exposed.

Figure 5A:
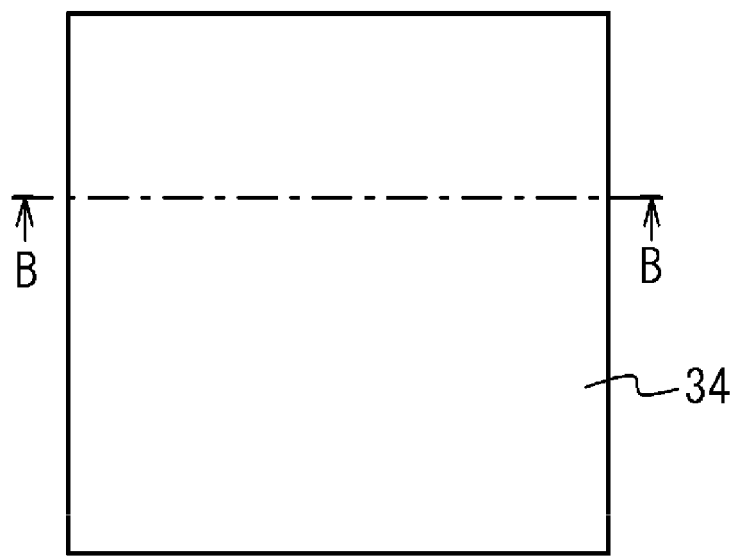
FIG. 5A is a top view of a fourth stage in a manufacturing process of a flash memory according to various embodiments.
Figure 5B:
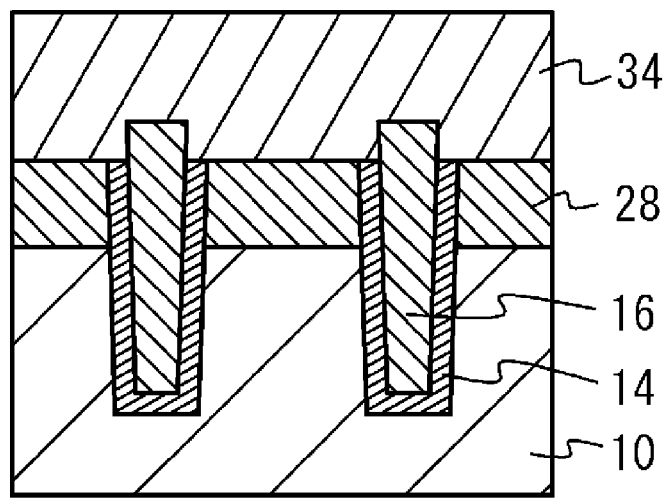
FIG. 5B is a sectional view taken along the line B-B shown in FIG. 5A.

Referring to FIGS. 5A and 5B, the first insulating film 14 and the mask layer 32 are etched by RIE or wet etching until the upper surface of the gate insulating film 28 is exposed. Consequently, the mask layer 32 and the first insulating film 14 provided on the upper surface and side surfaces of the mask layer 32 are removed so that the upper surface of the gate insulating film 28 and the upper surface of the first insulating film 14 are on the same plane. The second insulating film 16 protrudes from the upper surface of the gate insulating film 28. Subsequently, a conductive layer 34 formed of a polysilicon film is provided on the gate insulating film 28 by CVD so as to cover the second insulating film 16.

Figure 6A:
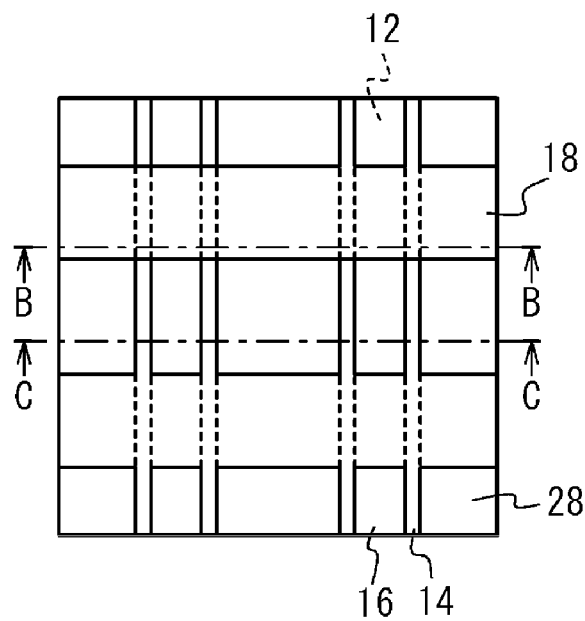
FIG. 6A is a top view of a fifth stage in a manufacturing process of a flash memory according to various embodiments.
Figure 6B:
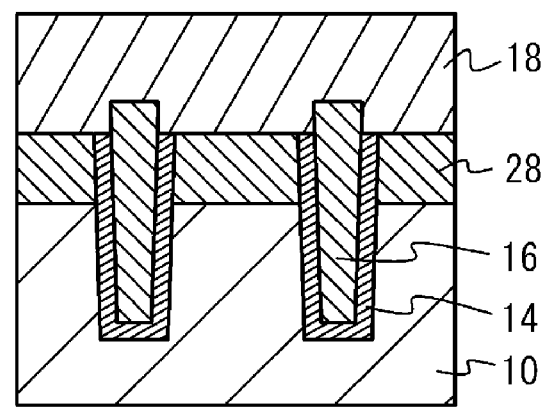
FIGS. 6B and 6C are sectional views taken along the lines B-B and C-C, respectively, shown in FIG. 6A.
Figure 6C:
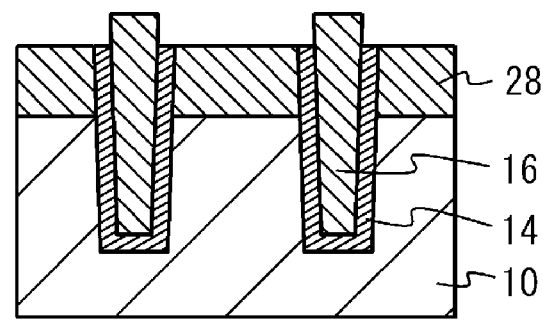

Referring to FIGS. 6A through 6C, the conductive layer 34 is etched by RIE with a photoresist (not shown) provided and extending to intersect with the trench 12 on the conductive layer 34 serving as a mask. Consequently, the word line 18 formed of the conductive layer 34 is provided extending to intersect with the trench 12. The width of the word line 18 is about 110 nm.

Figure 7A:
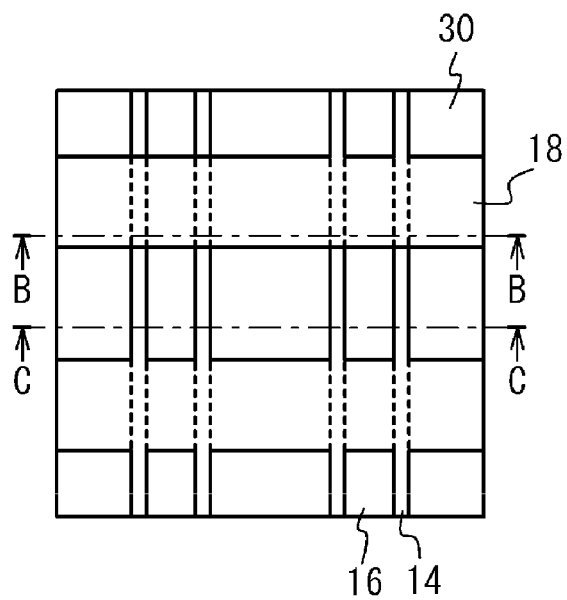
FIG. 7A is a top view of a sixth stage in a manufacturing process of a flash memory according to various embodiments.
Figure 7B:
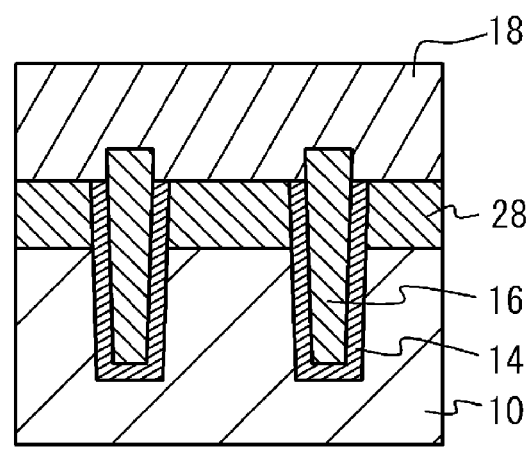
FIGS. 7B and 7C are sectional views taken along the lines B-B and C-C, respectively, shown in FIG. 7A.
Figure 7C:
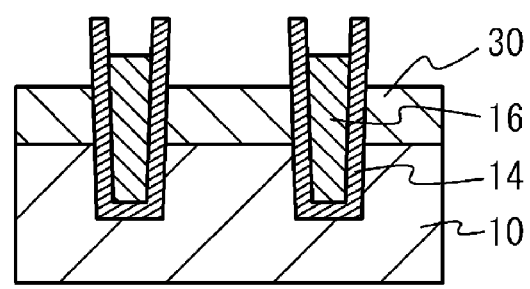
Figure 8A:
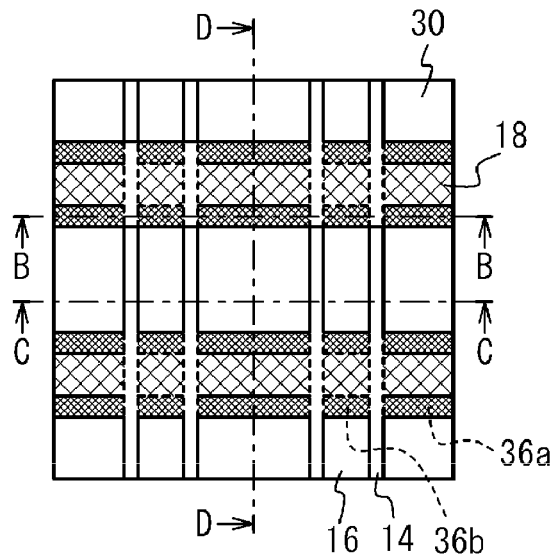
FIG. 8A is a top view of a seventh stage in a manufacturing process of a flash memory according to various embodiments.
Figure 8D:
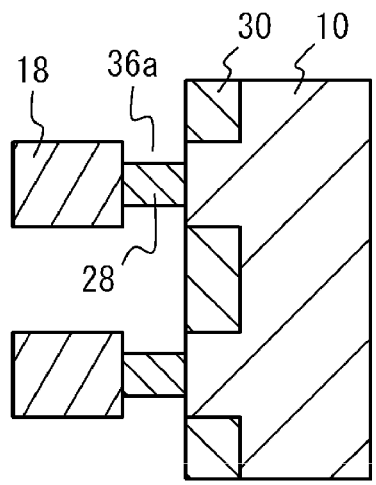
FIGS. 8B through 8D are sectional views taken along the lines B-B to D-D, respectively, shown in FIG. 8A.
Figure 8B:
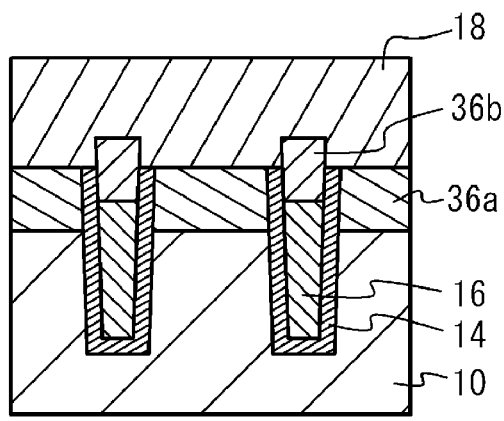
Figure 8C:
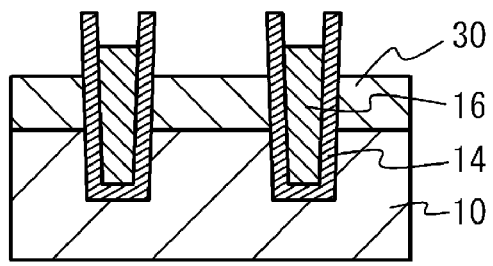
Figure 9A:
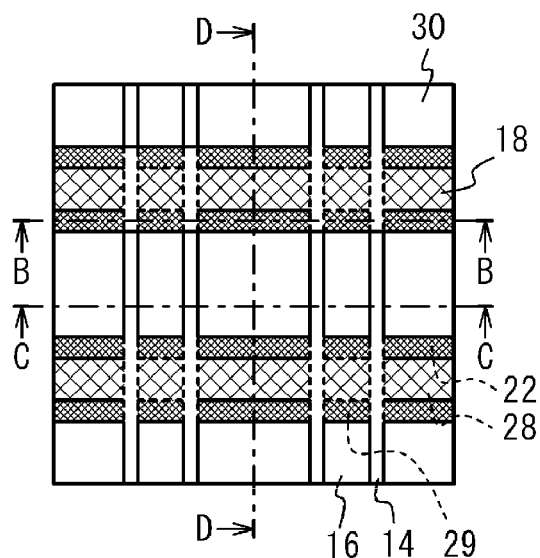
FIG. 9A is a top view of an eighth stage in a manufacturing process of a flash memory according to various embodiments.
Figure 9D:
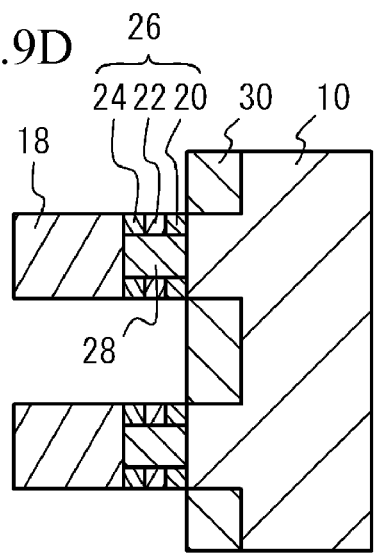
FIGS. 9B through 9D are sectional views taken along the lines B-B to D-D, respectively, shown in FIG. 9A.
Figure 9B:
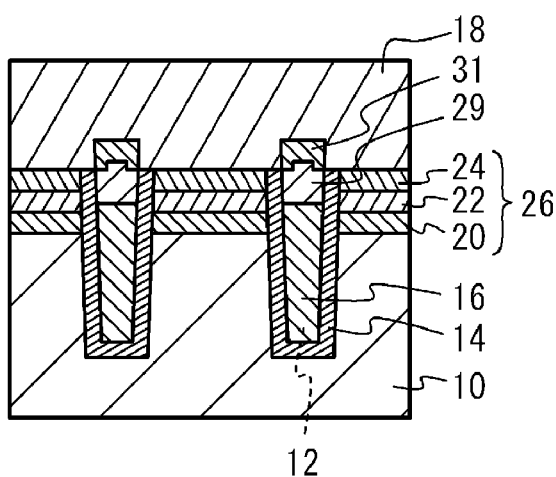
Figure 9C:
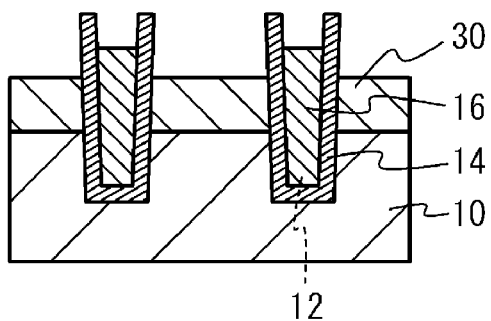

Referring to FIGS. 7A through 7C, the gate insulating film 28 is etched by RIE with the word line 18 serving as a mask until the upper surface of the semiconductor substrate 10 is exposed. Consequently, the gate insulating film 28 remains only under the word line 18. The second insulating film 16 is also etched at the same time as the gate insulating film 28 is etched since the gate insulating film 28 and the second insulating film 16 are both formed of a silicon oxide film. The first insulating film 14 is formed of a silicon nitride film which comprises a material different from that of the gate insulating film 28. Accordingly, the etching rate of the first insulating film 14 may be very slow compared with that of the gate insulating film 28. Subsequently, arsenic ions are implanted in the semiconductor substrate 10 with the word line 18, first insulating film 14 and the second insulating film 16 serving as masks. As a consequence, the diffusion regions 30 which are the source region and drain region are provided in between the adjacently arranged trenches 12 and on both sides in the width direction of the word line 18 in the semiconductor substrate 10.

Referring to FIGS. 8A through 8D, the gate insulating film 28 is etched by wet etching using hydrofluoric acid so as to make the gate insulating film 28 remain under the central area in the width direction of the word line 18. Accordingly, undercut sections 36a having a depth of about 30 nm from the side surfaces in the width direction of the word line 18 are provided under both ends in the width direction of the word line 18 where the gate insulating film 28 has been removed. As a consequence, the gate insulating film 28 having a width of about 50 nm remains under the central area in the width direction of the word line 18. Meanwhile, undercut sections 36b are provided under both ends in the width direction of the word line 18 where the second insulating film 16 has been removed since the second insulating film 16 is also etched by wet etching using hydrofluoric acid. In some embodiments, the first insulating film 14 formed of a silicon nitride film, which is a material different from that of the gate insulating film 28, is hardly etched by wet etching using hydrofluoric acid and thus remains as is.

Referring to FIGS. 9A through 9D, the semiconductor substrate 10 and the word line 18 are oxidized by thermal oxidation. Consequently, the tunnel insulating film 20 formed of a silicon oxide film and the top insulating film 24 formed of a silicon oxide film are provided in the undercut section 36a. The tunnel insulating film 20 and the top insulating film 24 have a thickness of about 9 nm. Meanwhile, a second silicon oxide film 31 is also provided in the undercut section 36b.

Subsequently, a polysilicon film is provided on the semiconductor substrate 10 by low-pressure CVD (LP-CVD) so as to cover the word line 18. The polysilicon film is also provided in both the undercut section 36a and the undercut section 36b because of superior step coverage characteristics of LP-CVD. The polysilicon film is then oxidized by thermal oxidation so as to make a silicon oxide film (not shown). Portions of the polysilicon film provided in both the undercut section 36a and the undercut section 36b, however, remain as polysilicon film since they are located in recessed areas and are less likely to be oxidized. As a consequence, the charge storage layer 22 formed of a polysilicon film having a thickness of about 7 nm is provided in the undercut section 36a in between the tunnel insulating film 20 and the top insulating film 24. Meanwhile, the dummy layer 29 formed of a polysilicon film which is the same material as that of the charge storage layer 22 is provided in the undercut section 36b.

According to the manufacturing method of the first embodiment, the gate insulating film 28 is provided on the semiconductor substrate 10 and, thereafter, the trench 12 is provided extending in the semiconductor substrate 10 and the gate insulating film 28 as shown in FIGS. 2A and 2B. The first insulating film 14 composed of a material different from that of the gate insulating film 28 is provided on side surfaces of the trench 12 as shown in FIGS. 3A and 3B. The second insulating film 16 composed of a material different from that of the first insulating film 14 is provided so as to be embedded in the trench 12 as shown in FIGS. 4A and 4B. The word line 18 extending to intersect with the trench 12 is provided on the gate insulating film 28 as shown in FIGS. 6A through 6C. Then, the gate insulating film 28 is removed so that the gate insulating film 28 remains under the central area in the width direction of the word line 18 on the semiconductor substrate 10 as shown in FIGS. 8A through 8D. The charge storage layers 22 are provided in the area where the gate insulating film 28 has been removed under both ends in the width direction of the word line 18 as shown in FIGS. 9A through 9D.

In one embodiment, the first insulating film 14 is largely unaffected and remains as is after removal of the gate insulating 28 is performed as shown in FIGS. 7A through 8D since the gate insulating film 28 and the first insulating film 14 are composed of materials different from each other as described above. Accordingly, in the manufacturing method according to the present embodiment, the upper surface of the first insulating film 14, which is provided on the side surfaces of the trench 12 provided in the semiconductor substrate 10, is provided above the upper surface of the charge storage layer 22 as shown in FIGS. 1A through 1D. The charge storage layer 22 provided under both ends in the width direction of the word line 18, therefore, is separated by the first insulating film 14 in the extending direction of the word line 18 at the trench 12. In other words, the charge storage layer 22 is separated in between memory cells adjacently arranged in the extending direction of the word line 18 and is also separated in between memory cells adjacently arranged in the width direction of the word line 18. Further, the gate insulating film 28 separated in the extending direction of the word line 18 by the first insulating film 14 is provided under the central area in the width direction of the word line 18, and the charge storage layers 22 are provided so as to enclose the gate insulating film 28. More specifically, the charge storage layer 22 is separated in a channel direction in the memory cell.

Accordingly, in the method according to the first embodiment, the charge storage layer 22 is provided to be separated in the channel direction in the memory cell. As a consequence, even if the charge storage layer 22 is formed of a conductive film such as a polysilicon film, two charge storage regions in a single memory cell can be provided, whereby two bits of data can be stored in a single memory cell. When the charge storage layer 22 is formed of a conductive film, the amount of electrical charges that can be stored is increased compared with the case which utilizes an insulating film. Meanwhile, for example, when the charge storage layer 22 is formed of an insulating film, two charge storage regions can be provided without separating the charge storage layer 22 in the channel direction. However, the charge storage layer 22 separated in the channel direction can prevent the influence of a so-called CBD in which electrical charges in two charge storage regions interfere with each other. Consequently, the electrical charges stored in the two charge storage regions can be separated more reliably, thereby providing superior characteristics. Accordingly, it may be preferable that the charge storage layer 22 be separated in the channel direction in the memory cell even when the charge storage layer 22 is formed of an insulating film. In particular, a shortened channel length as the miniaturization of memory cells advances enhances this effect of preventing CBD.

Further, in the method according to the first described embodiment, the charge storage layer 22 is separated in between adjacently arranged memory cells. For example, the electrical charges stored in the charge storage layer 22 may move around between adjacently arranged memory cells when the charge storage layer 22 is formed of a conductive film while the charge storage layer 22 is connected between the adjacently arranged memory cells, thereby influencing the threshold voltage of the adjacently arranged memory cells. Further, for example, the threshold voltage between adjacently arranged memory cells may also be influenced as the miniaturization of memory cells advances and the space between the memory cells gets narrower even when the charge storage layer 22 is formed of an insulating film. However, in the method according to the first embodiment, the charge storage layer 22 is separated in between the adjacently arranged memory cells. As a consequence, the influence to the threshold voltage of the adjacently arranged memory cell can be prevented even when the charge storage layer 22 is formed of a conductive film or an insulating film. Accordingly, in the method according to the first embodiment, broader options of the materials applicable for the charge storage layer 22 can be provided.

Further, the gate insulating film 28 under both ends in the width direction of the word line 18 is removed to provide the undercut sections 36a as shown in FIGS. 8A through 8D. Then, the charge storage layer 22 is provided in the undercut section 36a as shown in FIGS. 9A through 9D. In the manufacturing method according to the present embodiment, thus, the charge storage layer 22 and the word line 18 can be provided in a self-aligning manner.

Furthermore, the charge storage layer 22 is provided under both ends of the word line 18 as shown in FIGS. 1A through 1D. Accordingly, the charge storage layer 22 can store electrical charges more efficiently since an electrical field can be applied from the word line 18 as intended compared with the case in which the charge storage layer 22 is provided on the side surfaces of the gate electrode.

In further embodiments, the second insulating film 16 is provided so as to protrude from the upper surface of the gate insulating film 28 as shown in FIGS. 5A and 5B. Consequently, the upper surface of the second insulating film 16 can remain above the upper surface of the semiconductor substrate 10 even when removing the gate insulating film 28 until the upper surface of the semiconductor substrate 10 is exposed as shown in FIGS. 7A through 7C and subsequently removing the gate insulating film 28 under both ends of the word line 18 as shown in FIGS. 8A through 8D.

In one embodiment, a first etching is performed for etching the gate insulating film 28 until the upper surface of the semiconductor substrate 10 is exposed with the word line 18 serving as a mask by anisotropic etching such as RIE as shown in FIGS. 7A through 7C. Subsequently, a second etching Is performed for etching the gate insulating film 28 under both ends in the width direction of the word line 18 by isotropic etching such as wet etching using hydrofluoric acid as shown in FIGS. 8A through 8D. The manufacturing method according to the present embodiment facilitates the gate insulating film 28 remaining under the central area in the width direction of the word line 18. The method further facilitates the undercut section 36a where the gate insulating film 28 has been removed under both ends in the width direction of the word line 18 to be in a desirable size.

The trench 12 is provided in the gate insulating film 28 and the semiconductor substrate 10 with the mask layer 32 are provided on the gate insulating film 28 serving as a mask as shown in FIGS. 2A and 2B. The first insulating film 14 is thoroughly deposited so as to cover the side surfaces of the trench 12 as shown in FIGS. 3A and 3B. Then, the first insulating film 14 provided on the upper surface and the side surfaces of the mask layer 32 as well as the mask layer 32 is removed as shown in FIGS. 5A and 5B. In the manufacturing method according to the present embodiment, the upper surface of the first insulating film 14 can be provided on the same plane as the upper surface of the gate insulating film 28. The charge storage layers 22 are provided in the area under both ends of the word line 18 where the gate insulating film 28 has been removed (the undercut section 36a) as shown in FIGS. 9A through 9D. Accordingly, the charge storage layer 22 is more reliably separated by the first insulating film 14 in the extending direction of the word line 18 by making the upper surface of the first insulating film 14 to be on the same plane as the upper surface of the gate insulating film 28.

Since the gate insulating film 28 and the second insulating film 16 are both formed of a silicon oxide film, as shown in FIGS. 8A through 8D, the second insulating film 16 is also removed to provide the undercut section 36b while removing the gate insulating film 28 to provide the undercut section 36a. Then, the dummy layer 29 composed of the same material as that of the charge storage layer 22 is provided in the undercut section 36b while providing the charge storage layer 22 in the undercut section 36a as shown in FIGS. 9A through 9D.

While the first embodiment exemplifies the first insulating film 14 formed of a silicon nitride film, the present invention is not limited to this. Other materials may be used as long as the etching rate of the material is slower than that of the gate insulating film 28 when removing the gate insulating film 28. In this case, the upper surface of the first insulating film 14 can also be provided above the upper surface of the charge storage layer 22.

Second Embodiment

Figure 10A:
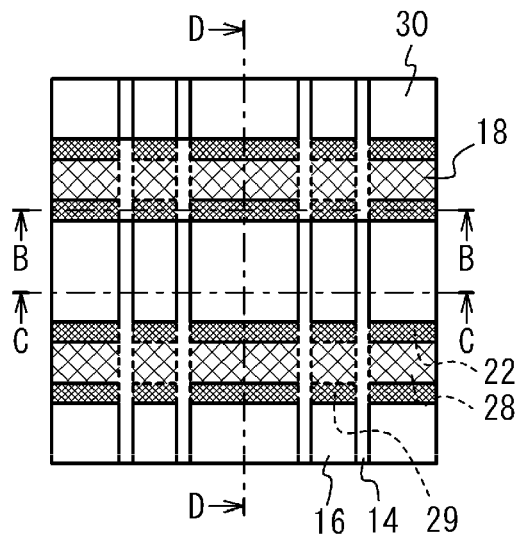
FIG. 10A is a top view of an alternate flash memory according to various embodiments.
Figure 10D:
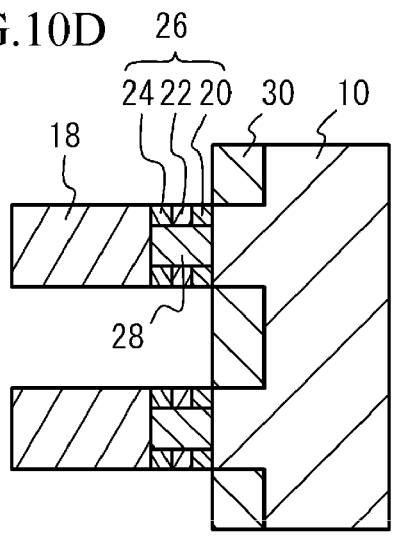
FIGS. 10B through 10D are sectional views taken along the lines B-B to D-D, respectively, shown in FIG. 10A.
Figure 10B:
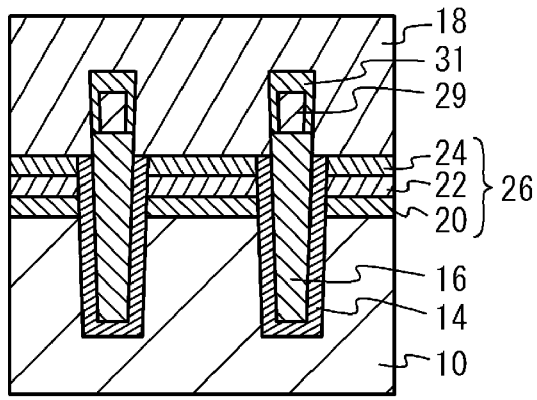
Figure 10C:
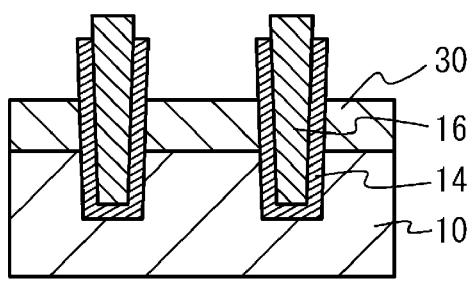

FIG. 10A is a top view of a flash memory according to a second embodiment of the present invention, and FIGS. 10B through 10D are sectional views taken along the lines B-B to D-D, respectively, shown in FIG. 10A. Referring to FIGS. 10A through 10D, the second insulating film 16 is provided protruded from the first insulating film 14 and the upper surface of the second insulating film 16 is provided above an upper surface of a layered film 26. Accordingly, the lower surface of the dummy layer 29 is provided above the upper surface of the layered film 26. In other words, the first insulating film 14 and the second insulating film 16 (silicon oxide film) are provided in between the charge storage layer 22 and the dummy layer 29. Other structures are the same as those of the flash memory according to the first embodiment and shown in FIGS. 1A through 1D, their descriptions are thus omitted.

Figure 11A:
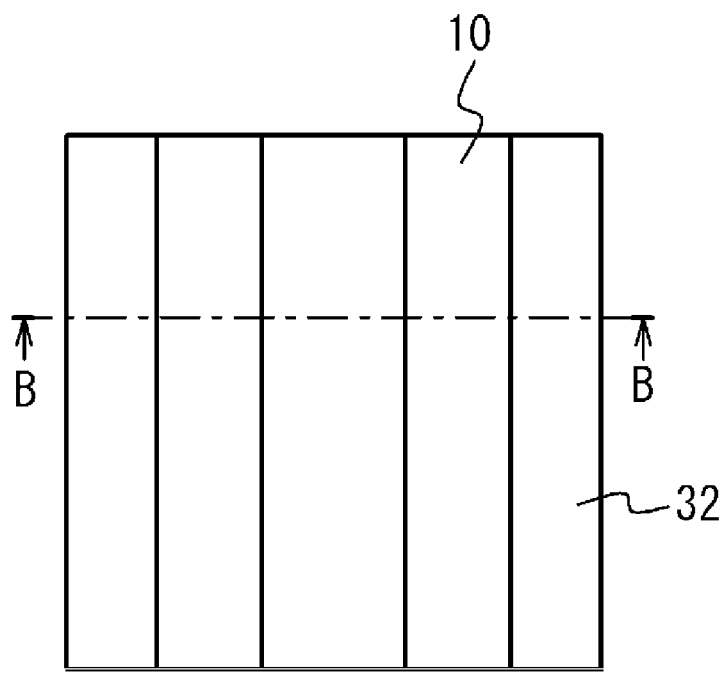
FIG. 11A is a top view of a first stage in a manufacturing process of an alternate flash memory according various embodiments.
Figure 11B:
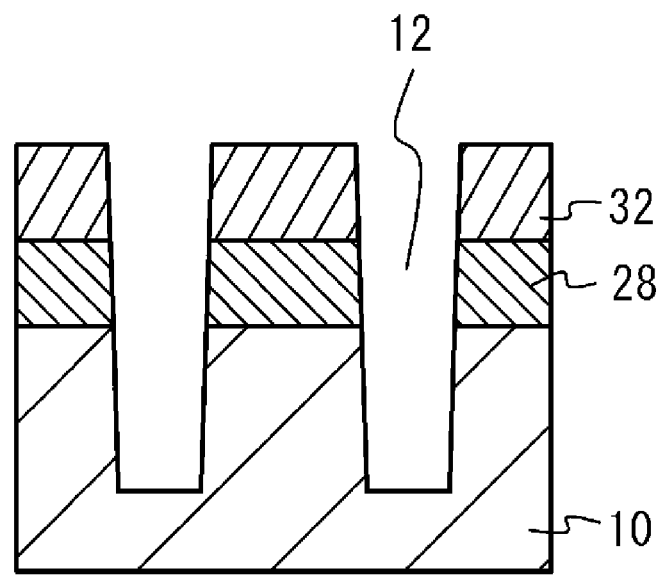
FIG. 11B is a sectional view taken along the line B-B shown in FIG. 11A.
Figure 12A:
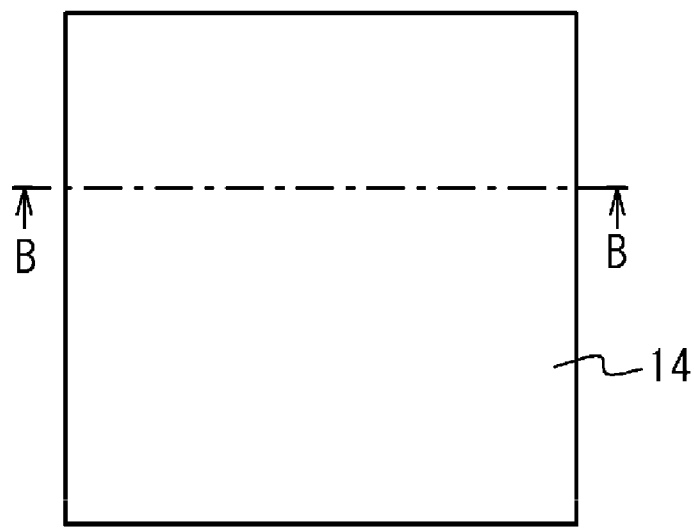
FIG. 12A is a top view of a second stage in a manufacturing process of an alternate flash memory according various embodiments.
Figure 12B:
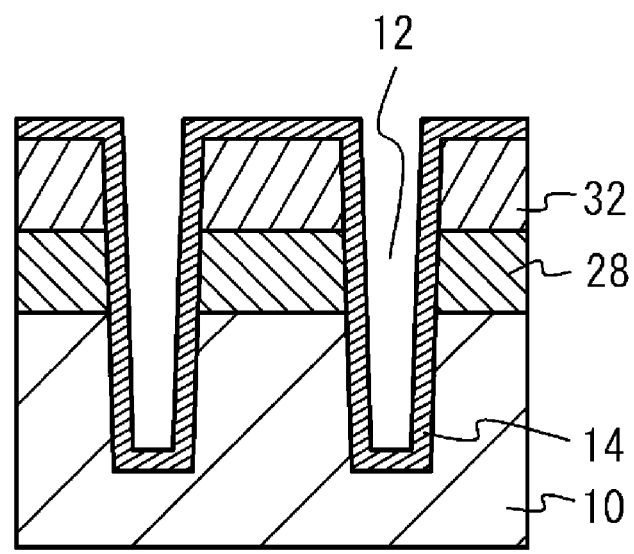
FIG. 12B is a sectional view taken along the line B-B shown in FIG. 12A.

Next, referring to FIGS. 11A through 19D, a method for manufacturing the flash memory according to the second embodiment will be described. Referring to FIGS. 11A and 11B, the gate insulating film 28 formed of a silicon oxide film is provided on the semiconductor substrate 10. The mask layer 32 formed of a silicon nitride film is provided so as to extend On the gate insulating film 28. Note that in one embodiment, the thickness of the mask layer 32 is made larger than that of the gate insulating film 28. The gate insulating film 28 and the semiconductor substrate 10 are etched with the mask layer 32 serving as a mask. Accordingly, the trench 12 is provided extending in the gate insulating film 28 and the semiconductor substrate 10. Referring to FIGS. 12A and 12B, the first insulating film 14 is provided to run along the side surfaces and the bottom surface of the trench 12.

Figure 13A:
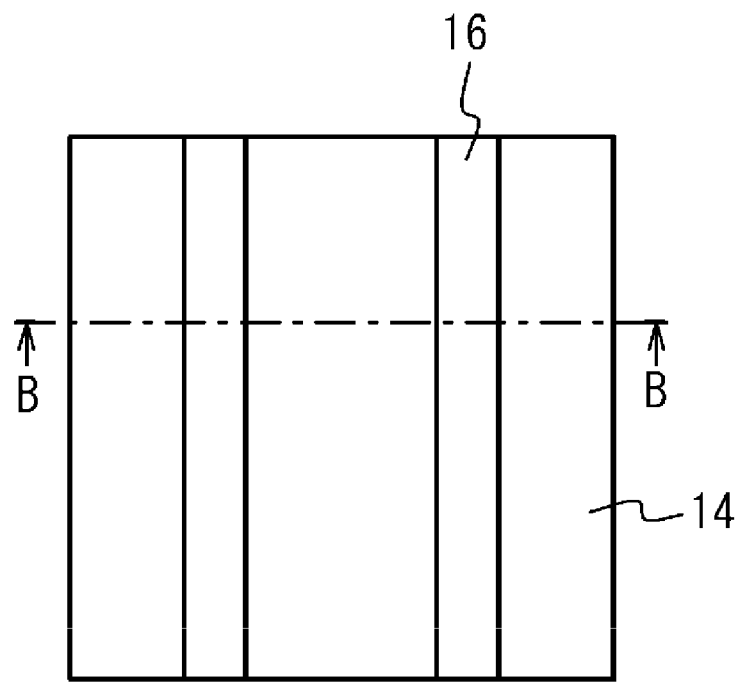
FIG. 13A is a top view of a third stage in a manufacturing process of an alternate flash memory according various embodiments.
Figure 13B:
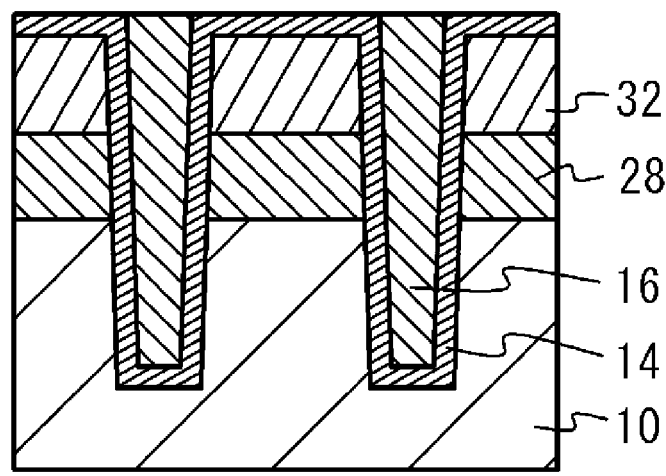
FIG. 13B is a sectional view taken along the line B-B shown in FIG. 13A.
Figure 14A:
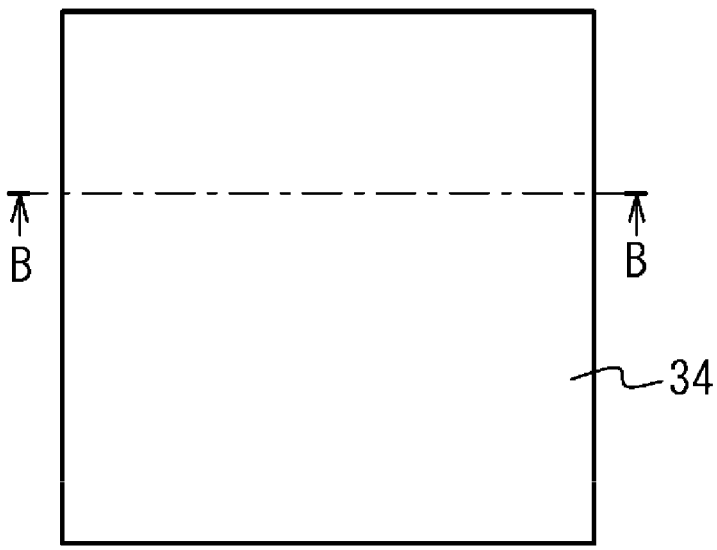
FIG. 14A is a top view of a fourth stage in a manufacturing process of an alternate flash memory according various embodiments.
Figure 14B:
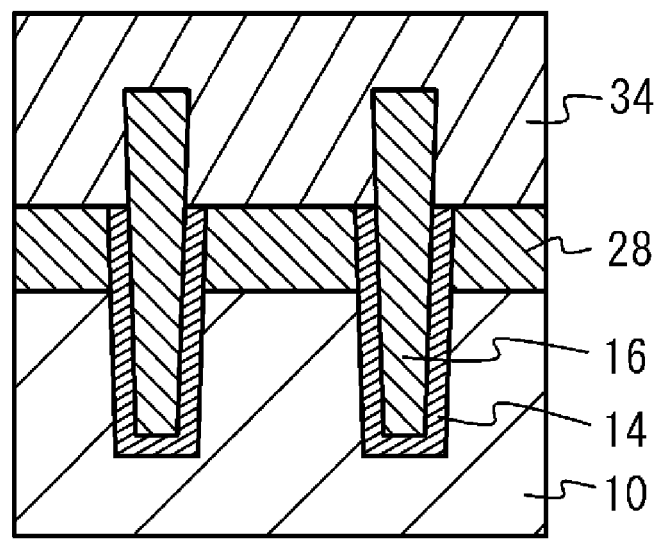
FIG. 14B is a sectional view taken along the line B-B shown in FIG. 14A.

Referring to FIGS. 13A and 13B, the second insulating film 16 formed of a silicon oxide film is provided so as to be embedded in the trench 12. Referring to FIGS. 14A and 14B, the first insulating film 14 and the mask layer 32 are etched so as to expose the upper surface of the gate insulating film 28. Subsequently, the conductive layer 34 formed of a polysilicon film is provided on the gate insulating film 28 so as to cover the second insulating film 16. The amount of protrusion of the second insulating film 16 protruding from the upper surface of the gate insulating film 28 is larger than the thickness of the gate insulating film 28 since the thickness of the mask layer 32 is larger than that of the gate insulating film 28.

Figure 15A:
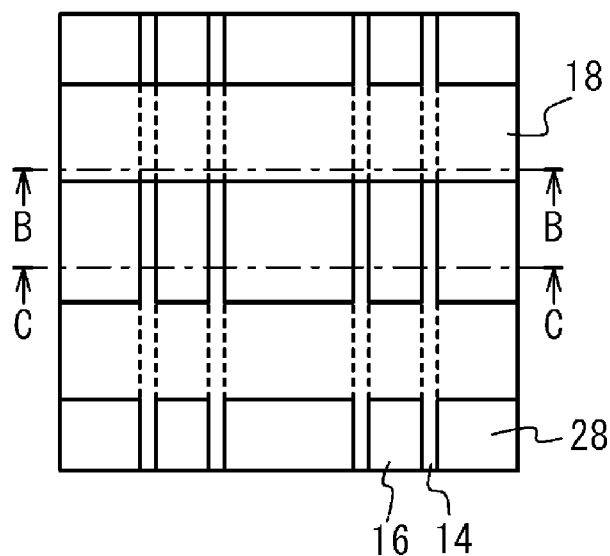
FIG. 15A is a top view of a fifth stage in a manufacturing process of an alternate flash memory according various embodiments.
Figure 15B:
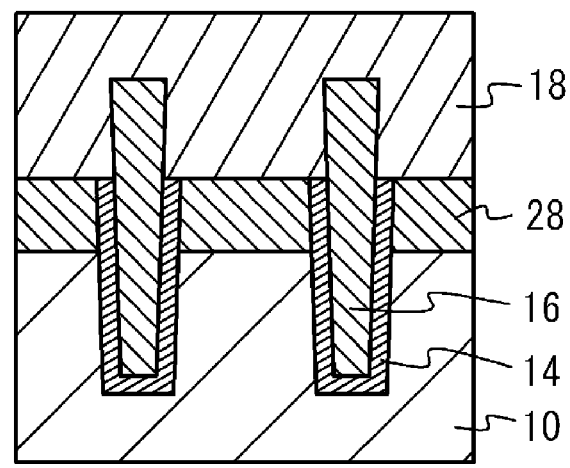
FIGS. 15B and 15C are sectional views taken along the lines B-B and C-C, respectively, shown in FIG. 15A.
Figure 15C:
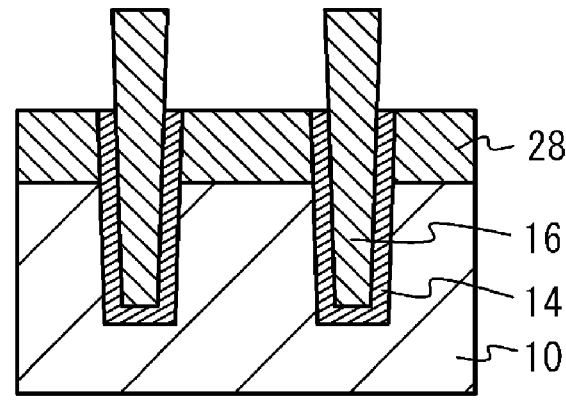
Figure 16A:
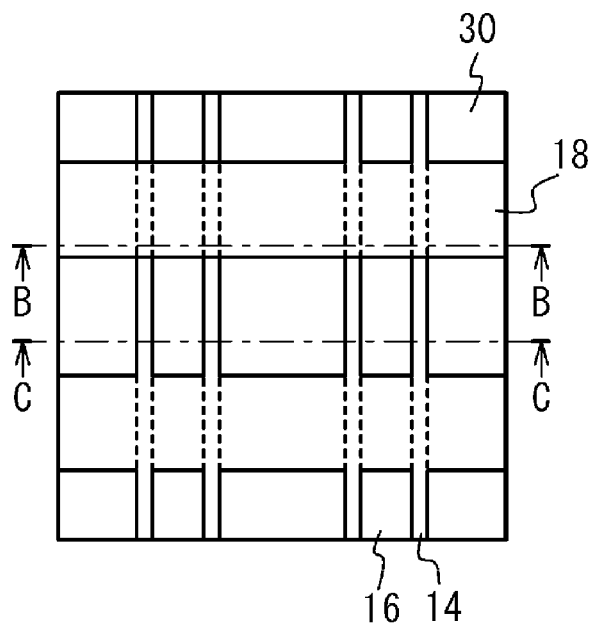
FIG. 16A is a top view of a sixth stage in a manufacturing process of an alternate flash memory according various embodiments.
Figure 16B:
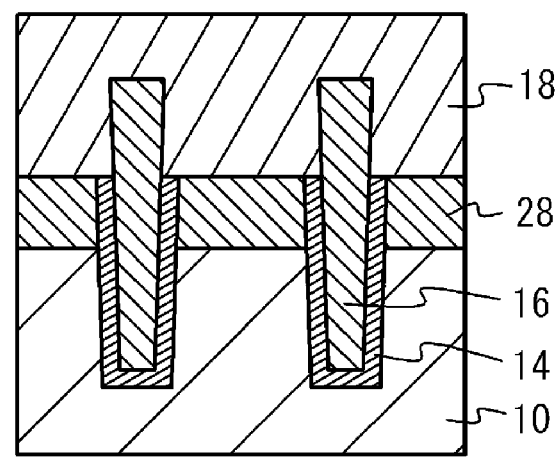
FIGS. 16B and 16C are sectional views taken along the lines B-B and C-C, respectively, shown in FIG. 16A.
Figure 16C:
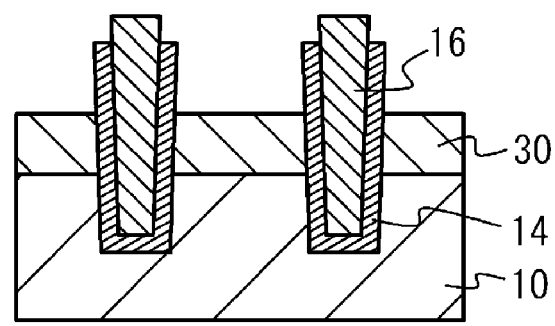
Figure 17A:
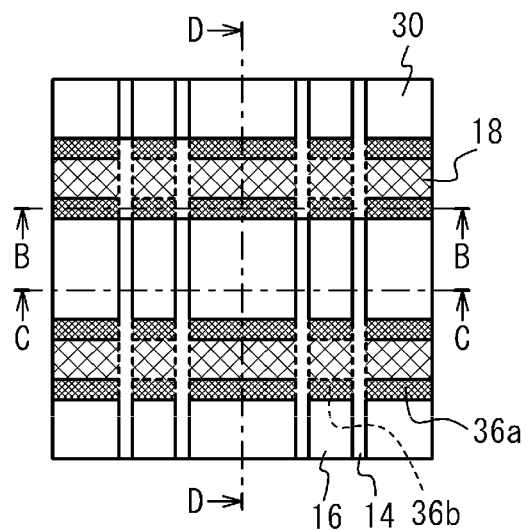
FIG. 17A is a top view of a seventh stage in a manufacturing process of an alternate flash memory according various embodiments.
Figure 17D:
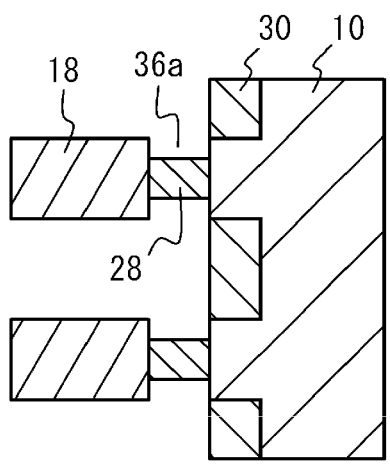
FIGS. 17B through 17D are sectional views taken along the lines B-B to D-D, respectively, shown in FIG. 17A.
Figure 17B:
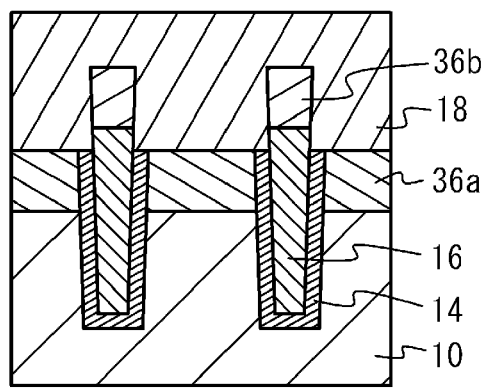
Figure 17C:
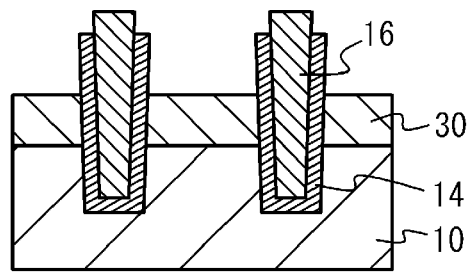
Figure 18A:
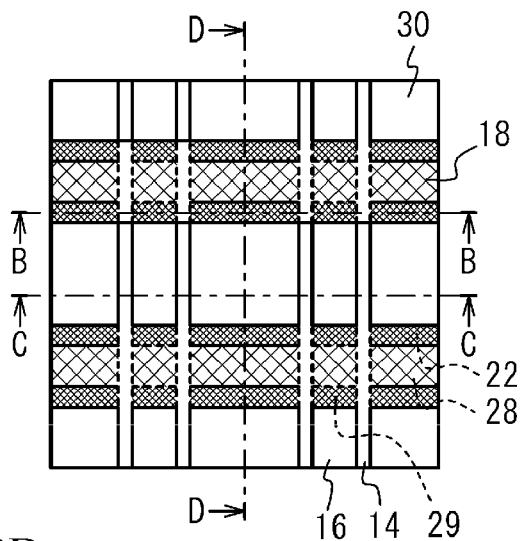
FIG. 18A is a top view of an eighth stage in a manufacturing process of an alternate flash memory according various embodiments.
Figure 18D:
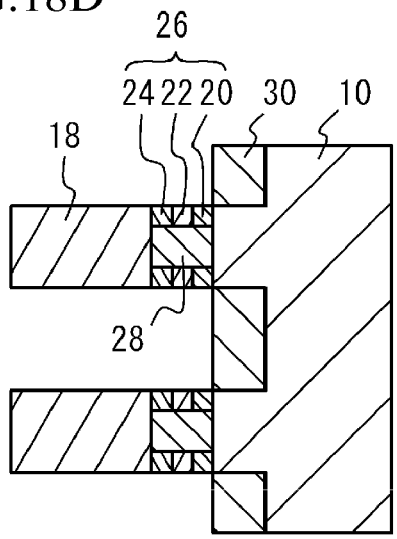
FIGS. 18B through 18D are sectional views taken along the lines B-B to D-D, respectively, shown in FIG. 18A.
Figure 18B:
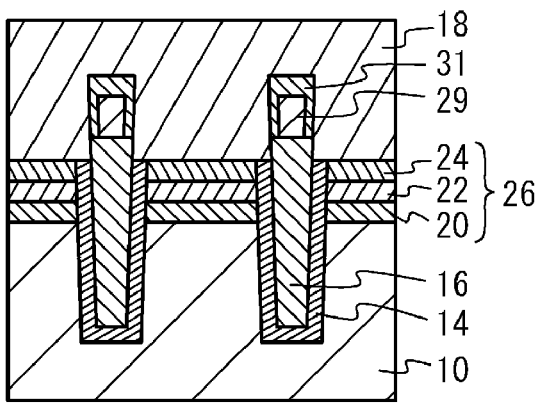
Figure 18C:
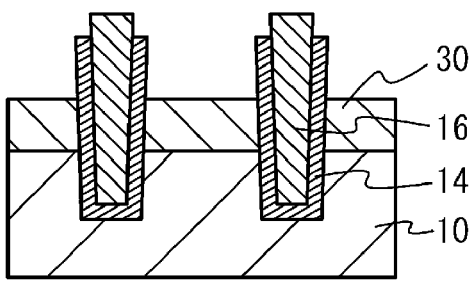

Referring to FIGS. 15A through 15C, the conductive layer 34 is etched with a photoresist (not shown) provided extending on the conductive layer 34 serving as a mask to provide the word line 18 extending to intersect with the trench 12. Referring to FIGS. 16A through 16C, the gate insulating film 28 is etched with the word line 18 serving as a mask until the upper surface of the semiconductor substrate 10 is exposed. Subsequently, arsenic ions are implanted in the semiconductor substrate 10 with the word line 18, first insulating film 14 and the second insulating film 16 serving as masks to provide the diffusion region 30.

Referring to FIGS. 17A through 17D, the gate insulating film 28 is etched by wet etching using hydrofluoric acid to provide the undercut sections 36a under both ends in the width direction of the word line 18. Meanwhile, the undercut sections 36b are provided under both ends in the width direction of the word line 18 as the second insulating film 16 is also etched at the same time. Referring to FIGS. 18A through 18D, the semiconductor substrate 10 and the word line 18 are oxidized by thermal oxidation to provide the tunnel insulating film 20 and the top insulating film 24 in the undercut section 36a. The second silicon oxide film 31 is also provided in the undercut section 36b at the same time. Subsequently, the charge storage layer 22 formed of a polysilicon film is provided in the undercut section 36a. The dummy layer 29 formed of the same material as that of the charge storage layer 22 is also provided in the undercut section 36b at the same time.

According to the method of the second embodiment, the thickness of the mask layer 32 in one embodiment is made larger than that of the gate insulating film 28 as shown in FIGS. 11A and 11B. Accordingly, the upper surface of the second insulating film 16 can be provided to be above the upper surface of the layered film 26 after the layered film 26 is provided in the undercut section 36a as shown in FIGS. 18A through 18D. In other words, the lower surface of the dummy layer 29 is provided above the upper surface of the charge storage layer 22. Consequently, in the method according to the second embodiment, the first insulating film 14 and the second insulating film 16 (silicon oxide film) can be provided in between the charge storage layer 22 and the dummy layer 29.

For example, when the charge storage layer 22 is formed of a silicon nitride film, all of the charge storage layer 22, the first insulating film 14 and the dummy layer 29 are formed of the same material. If only the first insulating film 14 is provided in between the charge storage layer 22 and the dummy layer 29, electrical charges stored in the charge storage layer 22 may transfer onto the dummy layer 29 through the first insulating film 14. However, in the method according to the second embodiment, the first insulating film 14 and the second insulating film 16 (silicon oxide film) are provided in between the charge storage layer 22 and the dummy layer 29, thereby preventing the electrical charges stored in the charge storage layer 22 from transferring even if the charge storage layer 22 is formed of a silicon nitride film.

As a consequence, in the method according to the second embodiment, it is possible to prevent the electrical charges stored in the charge storage layer 22 from transferring even if the charge storage layer 22 is formed of a conductive film such as a polysilicon film or a silicon nitride film which is the same material as that of the first insulating film 14.

Third Embodiment

Figure 19A:
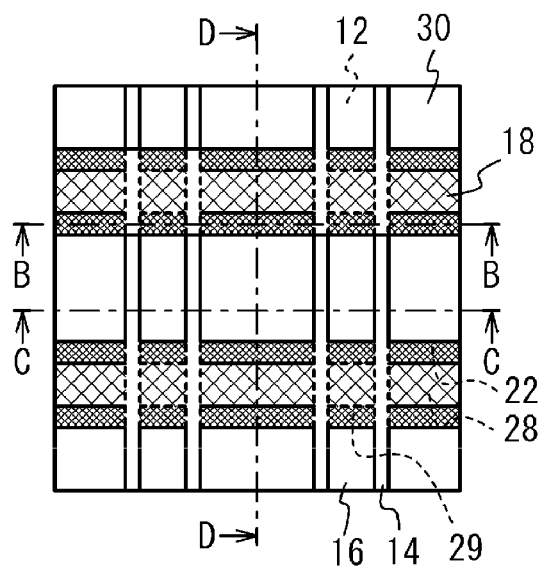
FIG. 19A is a top view of a flash memory according to a third embodiment of the present invention.
Figure 19D:
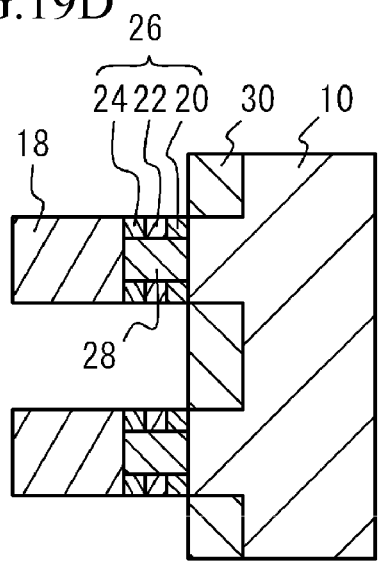
FIGS. 19B through 19D are sectional views taken along the lines B-B to D-D, respectively, shown in FIG. 19A.
Figure 19B:
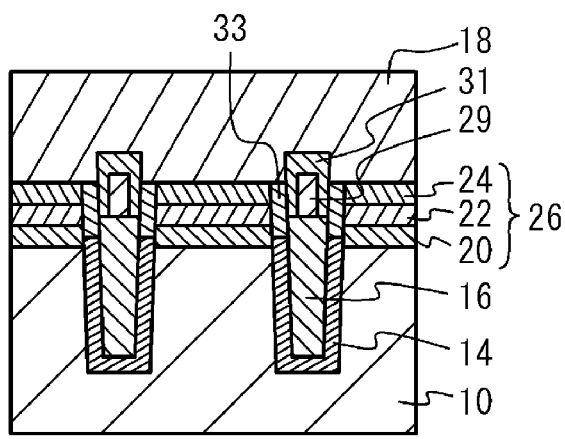
Figure 19C:
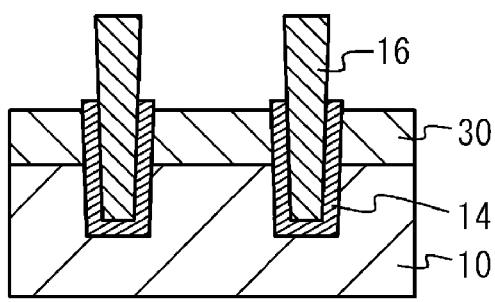

FIG. 19A is a top view of a flash memory according to a third embodiment of the present invention, and FIGS. 19B through 19D are sectional views taken along the lines B-B to D-D, respectively, shown in FIG. 19A. Referring to FIGS. 19A through 19D, the upper surface of the first insulating film 14 is provided below the lower surface of the charge storage layer 22. A first silicon oxide film 33 is provided in between the charge storage layer 22 and the dummy layer 29 on the first insulating film 14. Other structures are the same as those of the first embodiment and shown in FIGS. 1A through 1D, their descriptions are thus omitted.

Next, referring to FIGS. 20A through 24D, a method for manufacturing the flash memory according to the third embodiment will be described. First, the manufacturing steps described with reference to FIGS. 2A through 4B are performed. Thereafter, referring to FIGS. 20A and 20B, the first insulating film 14 and the mask layer 32 are etched so as to expose the upper surface of the gate insulating film 28 and to make the upper surface of the first insulating film 14 below the area where the charge storage layer 22 is to be provided which will be described later. The conductive layer 34 formed of a polysilicon film is then provided on the gate insulating film 28 so as to cover the second insulating film 16.

Figure 21A:
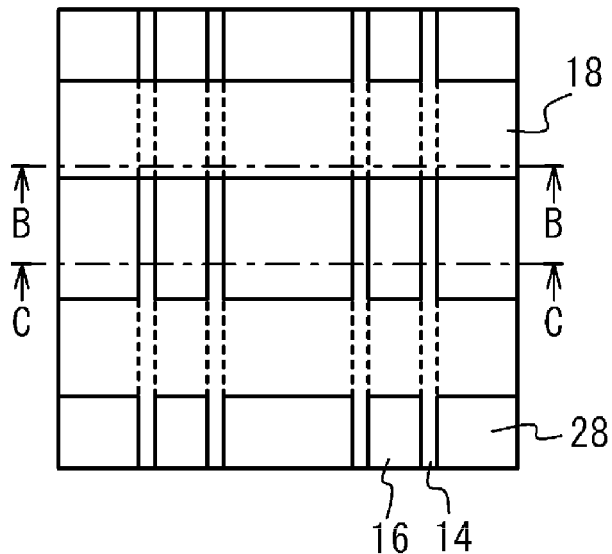
FIG. 21A is a top view of a second stage in a manufacturing process of a flash memory according to the third embodiment.
Figure 21B:
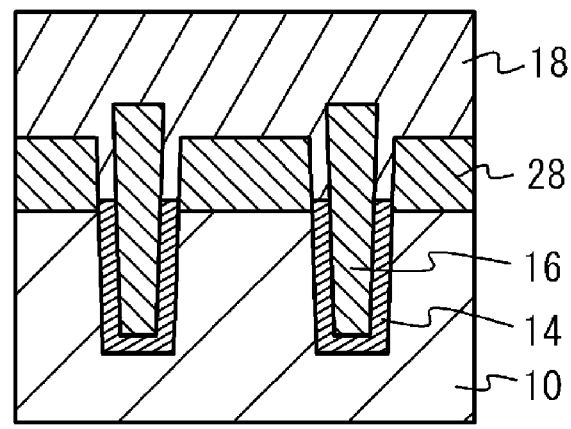
FIGS. 21B and 21C are sectional views taken along the lines B-B and C-C, respectively, shown in FIG. 21A.
Figure 21C:
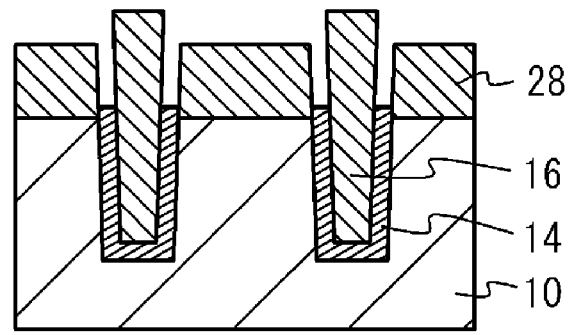
Figure 22A:
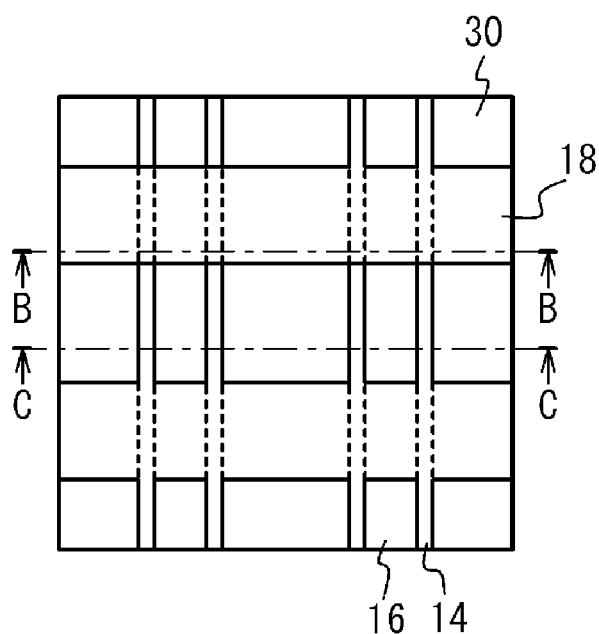
FIG. 22A is a top view of a third stage in a manufacturing process of a flash memory according to the third embodiment.
Figure 22B:
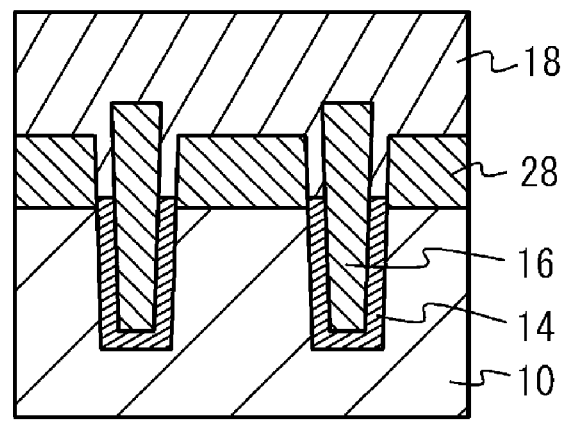
FIGS. 22B and 22C are sectional views taken along the lines B-B and C-C, respectively, shown in FIG. 22A.
Figure 22C:
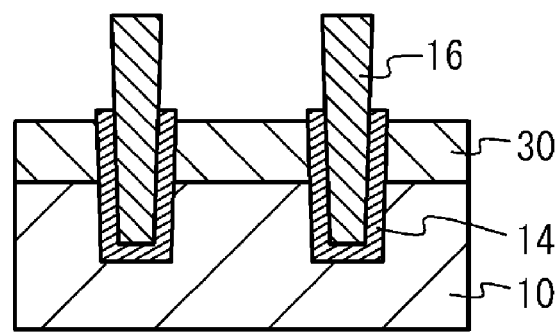
Figure 23A:
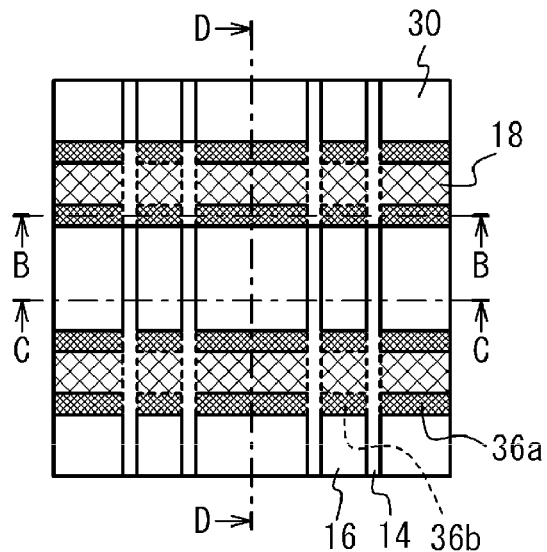
FIG. 23A is a top view of a fourth stage in a manufacturing process of a flash memory according to the third embodiment.
Figure 23D:
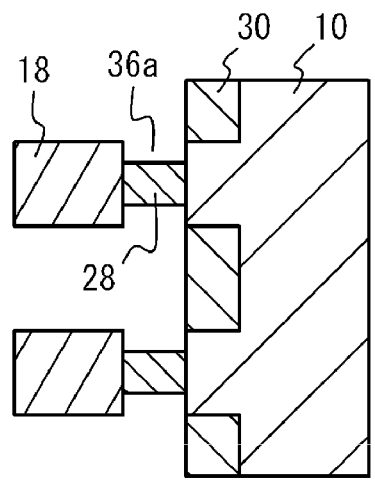
FIGS. 23B through 23D are sectional views taken along the lines B-B to D-D, respectively, shown in FIG. 23A.
Figure 23B:
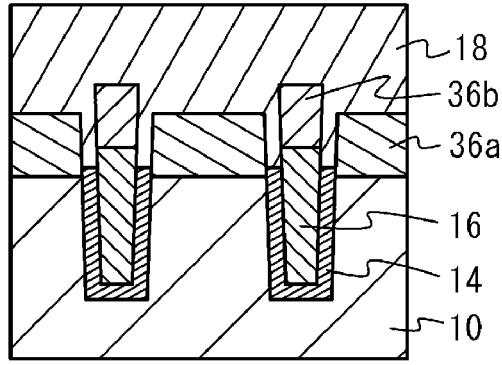
Figure 23C:
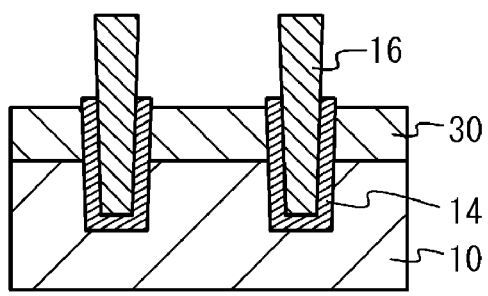
Figure 24A:
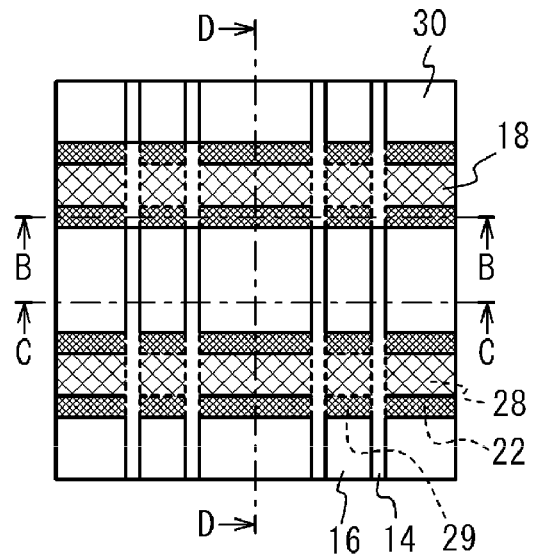
FIG. 24A is a top view of a fifth stage in a manufacturing process of a flash memory according to the third embodiment.
Figure 24D:
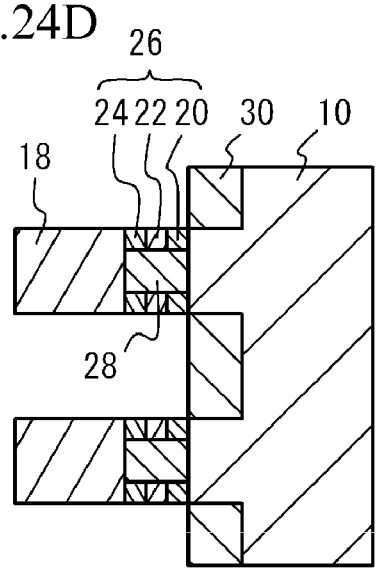
FIGS. 24B through 24D are sectional views taken along the lines B-B to D-D, respectively, shown in FIG. 24A.
Figure 24B:
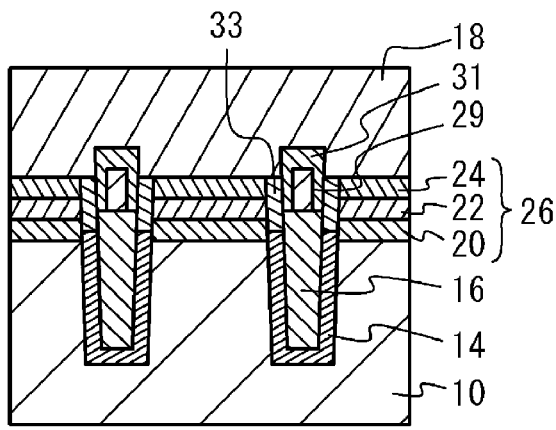
Figure 24C:
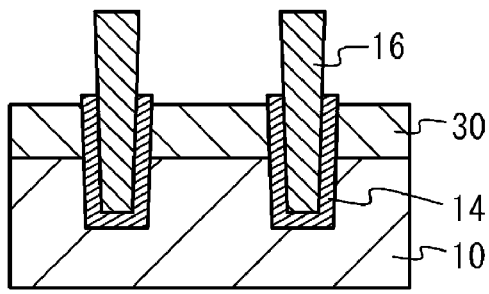
Figure 25A:
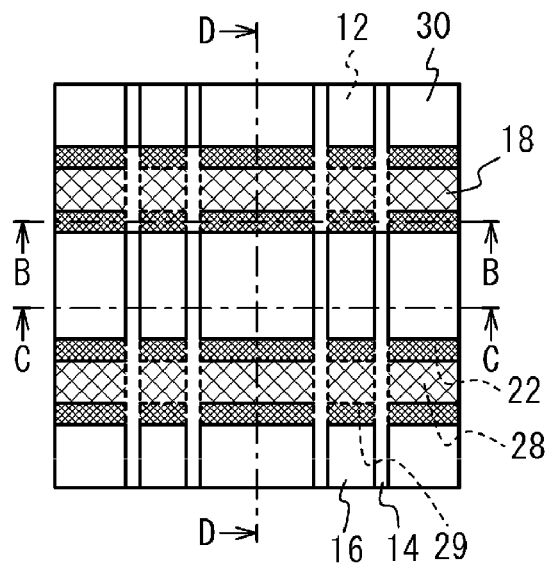
FIG. 25A is a top view of a sixth stage in a manufacturing process of a flash memory according to the third embodiment.
Figure 25D:
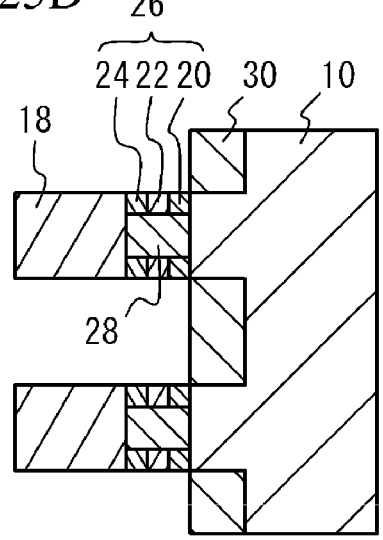
FIGS. 25B through 25D are sectional views taken along the lines B-B to D-D, respectively, shown in FIG. 25A.
Figure 25B:
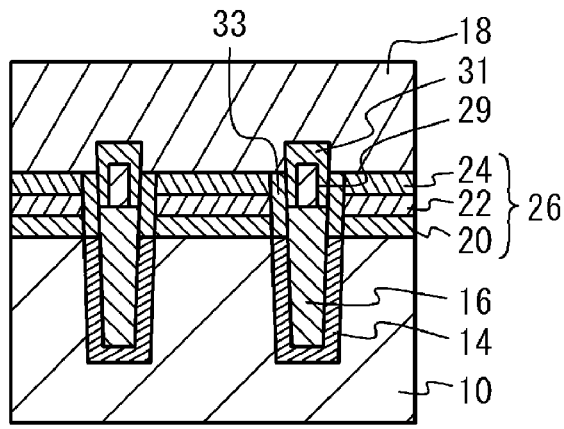
Figure 25C:
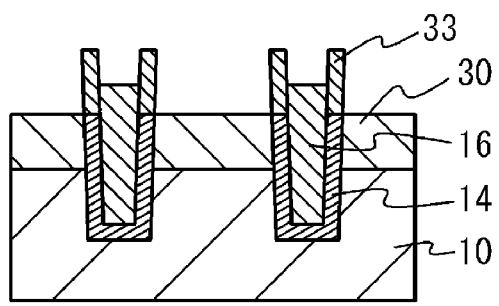

Referring to FIGS. 21A through 21C, the conductive layer 34 is etched with a photoresist (not shown) provided so as to extend on the conductive layer 34 serving as a mask to provide the word line 18 extending to intersect with the trench 12. Referring to FIGS. 22A through 22C, the gate insulating film 28 is etched with the word line 18 serving as a mask until the upper surface of the semiconductor substrate 10 is exposed. Subsequently, arsenic ions are implanted in the semiconductor substrate 10 with the word line 18, the first insulating film 14 and the second insulating film 16 serving as masks to provide the diffusion region 30.

Referring to FIGS. 23A through 23D, the gate insulating film 28 is etched by wet etching using hydrofluoric acid to provide the undercut sections 36a under both ends in the width direction of the word line 18. Meanwhile, the undercut sections 36b are provided under both ends in the width direction of the word line 18 since the second insulating film 16 is also etched at the same time. Referring to FIGS. 24A through 24D, the semiconductor substrate 10 and the word line 18 are oxidized by thermal oxidation to provide the tunnel insulating film 20 and the top insulating film 24 in the undercut section 36a. The second oxide film 31 is provided in the undercut section 36b at the same time. Subsequently, the charge storage layer 22 formed of a polysilicon film is provided in the undercut section 36a. The dummy layer 29 composed of the same material as that of the charge storage layer 22 is also provided in the undercut section 36b at the same time.

Figure 20A:
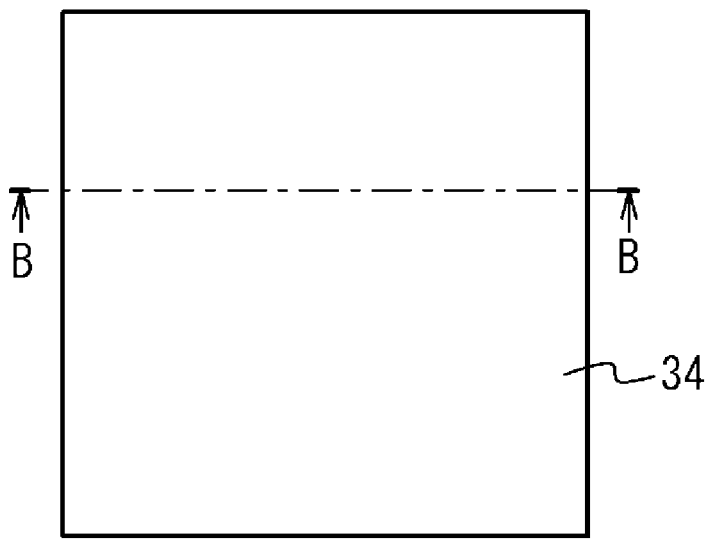
FIG. 20A is a top view of a first stage in a manufacturing process of a flash memory according to the third embodiment.
Figure 20B:
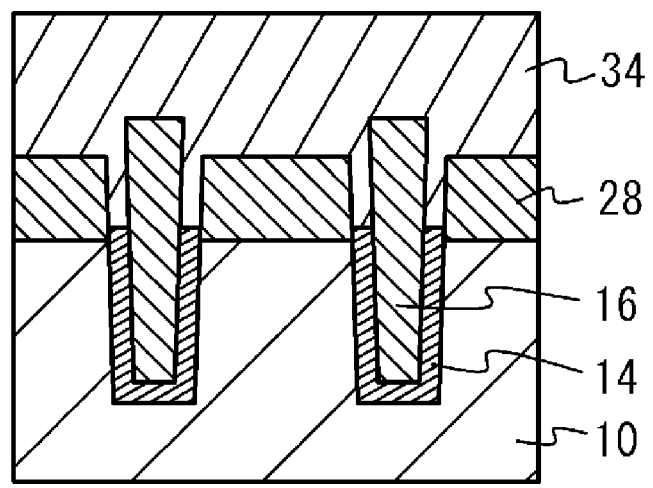
FIG. 20B is a sectional view taken along the line B-B shown in FIG. 20A.

According to the manufacturing method of the third embodiment, the first insulating film 14 is removed so as to make the upper surface of the first insulating film 14 to be below the area where the charge storage layer 22 is to be provided as shown in FIGS. 20A and 20B. Then, the conductive layer 34 is provided so as to be embedded in the area where the first insulating film 14 has been removed. The first silicon oxide film 33 is provided on the first insulating film 14 since the conductive layer 34 embedded in the area where the first insulating film 14 has been removed is also oxidized when providing the tunnel insulating film 20 and the top insulating film 24 by thermal oxidation as shown in FIGS. 24A through 24D. In other words, in the method according to the third embodiment, the first silicon oxide film 33 can be provided lateral to the charge storage layer 22 and in between the charge storage layer 22 and the dummy layer 29. As a consequence, it is possible to prevent the stored electrical charges from transferring even if the charge storage layer 22 is formed of a polysilicon film or a silicon nitride film which is the same material as that of the first insulating film 14.

Fourth Embodiment

A method for manufacturing a flash memory according to a fourth embodiment of the present invention first performs the same manufacturing steps as for the flash memory according to the first embodiment as shown in FIGS. 2A through 8D. Thereafter, in the manufacturing steps shown in FIGS. 9A through 9D, the semiconductor substrate 10 and the word line 18 are oxidized by radical oxidation or plasma oxidation to provide the tunnel insulating film 20 and the top insulating film 24 in the undercut section 36a. In this case, the first silicon oxide film 33 is provided as the first insulating film 14 is also oxidized because the silicon nitride film is likely to be oxidized by radical oxidation or plasma oxidation. Subsequently, the charge storage layer 22 is provided in the undercut section 36a. In this case, the dummy layer 29 composed of the same material as that of the charge storage layer 22 is also provided in the undercut section 36b at the same time.

In the manufacturing method according to the fourth embodiment, the first silicon oxide film 33 can be provided lateral to the charge storage layer 22 and in between the charge storage layer 22 and the dummy layer 29 when providing the tunnel insulating film 20 and the top insulating film 24 by radical oxidation or plasma oxidation as shown in FIGS. 25A through 25D. Accordingly, it is possible to prevent the electrical charges stored in the charge storage layer 22 from transferring even if the charge storage layer 22 is formed of a polysilicon film or a silicon nitride film which is the same material as that of the first insulating film 14.

While the manufacturing method according to the fourth embodiment exemplifies radical oxidation or plasma oxidation so as to provide the layered film 26 based on the manufacturing method according to the first embodiment, the present invention is not limited to this. The manufacturing method according to the fourth embodiment may also be applied to the manufacturing methods according to the second and the third embodiments. In addition, the present invention is not limited to radical oxidation and plasma oxidation, and other oxidation methods may be used as long as a silicon nitride film is also oxidized at the same time as a silicon film is.

While the following exemplary configurations are shown as incorporating specific, enumerated features and elements, it is understood that such depiction is exemplary. Accordingly, embodiments are well suited to applications involving different, additional, or fewer elements, features, or arrangements.

The invention claimed is:

1. A semiconductor device comprising:
   a semiconductor substrate, the semiconductor substrate having a trench;
   a first insulating film provided on a plurality of surfaces of the trench;
   a second insulating film provided to be embedded in the trench;
   a word line intersecting with the trench above the semiconductor substrate;
   a gate insulating film separated from the word line by the trench and provided under a central area in a width direction of the word line on the semiconductor substrate; and
   a charge storage layer separated in the direction of the word line by the trench and provided under the word line on the semiconductor substrate so as to enclose the gate insulating film.

2. The semiconductor device according to claim 1, wherein the first insulating film is provided on a plurality of side surfaces of the trench.

3. The semiconductor device according to claim 1, wherein the second insulating film is composed of a material different from that of the first insulating film 4. The semiconductor device according to claim 1, wherein the gate insulating film is composed of a material different from that of the first insulating film 5. The semiconductor device according to claim 1, wherein an upper surface of the first insulating film is provided below a lower surface of the charge storage layer.

6. The semiconductor device according to claim 1, wherein an oxide film is provided on the first insulating film.

7. The semiconductor device according to claim 5, wherein the charge storage layer is separated by the oxide film.

8. The semiconductor device according to claim 1, wherein an upper surface of the first insulating film is provided above an upper surface of the charge storage layer, and the charge storage layer is separated by the first insulating film.

9. The semiconductor device according to claim 1, wherein an upper surface of the second insulating film is provided above an upper surface of the charge storage layer.

10. The semiconductor device according to claim 1, wherein
   the charge storage layer is composed of a material different from that of the first insulating film.

11. A semiconductor device comprising:
   a semiconductor substrate, the semiconductor substrate having a trench;
   a first insulating film provided on a plurality of side surfaces of the trench;
   a second insulating film provided to be embedded in the trench;
   a word line intersecting with the trench above the semiconductor substrate;
   a gate insulating film separated from the word line by the trench and provided under a central area in a width direction of the word line on the semiconductor substrate; and
   a charge storage layer separated in the direction of the word line by the trench and provided under the word line on the semiconductor substrate so as to enclose the gate insulating film,
   wherein the second insulating film is composed of a material different from that of the first insulating film, and
   wherein the gate insulating film is composed of a material different from that of the first insulating film.

* * * * *